United States Patent
Hayashi et al.

(10) Patent No.: US 8,044,445 B2
(45) Date of Patent: Oct. 25, 2011

(54) PHOTOELECTRIC CONVERSION DEVICE AND METHOD OF MANUFACTURING THE SAME

(75) Inventors: Masami Hayashi, Tokyo (JP); Takashi Miyayama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 116 days.

(21) Appl. No.: 12/556,193

(22) Filed: Sep. 9, 2009

(65) Prior Publication Data

US 2010/0059804 A1  Mar. 11, 2010

(30) Foreign Application Priority Data

Sep. 10, 2008 (JP) ................ 2008-232085

(51) Int. Cl.
*H01L 31/113* (2006.01)

(52) U.S. Cl. .............. 257/292; 257/53; 257/55; 257/59; 257/288; 257/290; 438/96; 438/97; 438/151; 438/164

(58) Field of Classification Search .................. None
See application file for complete search history.

(56) References Cited

U.S. PATENT DOCUMENTS

| | | | |
|---|---|---|---|
| 6,236,063 B1 * | 5/2001 | Yamazaki et al. | ............ 257/59 |
| 6,753,915 B1 | 6/2004 | Mochizuki | |
| 2007/0113886 A1 | 5/2007 | Arao et al. | |
| 2009/0026509 A1 | 1/2009 | Hayashi et al. | |
| 2009/0152563 A1 | 6/2009 | Hayashi et al. | |

FOREIGN PATENT DOCUMENTS

| | | |
|---|---|---|
| JP | 2000-101920 | 4/2000 |
| JP | 2007-165865 | 6/2007 |

* cited by examiner

*Primary Examiner* — N Drew Richards
*Assistant Examiner* — Kyoung Lee
(74) *Attorney, Agent, or Firm* — Oblon, Spivak, McClelland, Maier & Neustadt, L.L.P.

(57) ABSTRACT

A photoelectric conversion device includes a thin film transistor that is placed on a substrate, a photodiode that is connected to a drain electrode of the thin film transistor and includes an upper electrode, a lower electrode and a photoelectric conversion layer placed between the upper and lower electrodes, a first interlayer insulating film that covers at least the upper electrode, a second interlayer insulating film that is placed in an upper layer of the first interlayer insulating film and covers the thin film transistor and the photodiode, and a line that is connected to the upper electrode through a contact hole disposed in the first interlayer insulating film and the second interlayer insulating film.

19 Claims, 20 Drawing Sheets

PHOTOELECTRIC CONVERSION DEVICE AND METHOD OF MANUFACTURING THE SAME

BACKGROUND OF THE INVENTION

1. Field of the Invention

The present invention relates to a photoelectric conversion device and a method of manufacturing the same. Particularly, the present invention relates to a photoelectric conversion device that uses a substrate on which light receiving pixels including photodiodes and thin film transistors are arranged in an array, and a method of manufacturing the same.

2. Description of Related Art

A photosensor, which is a photoelectric conversion device, is a flat panel that includes a TFT array substrate on which a photodiode that photoelectrically converts visible light into an electric charge and a thin film transistor (TFT) are arranged. The photosensor is widely used in application to a contact image sensor, an X-ray imaging display device or the like. Particularly, a flat panel X-ray imaging display device (which is referred to hereinafter as a flat panel detector (FPD)) in which a scintillator that converts an X-ray into visible light is placed on a TFT array substrate is a promising device for application to the medical industry or the like.

In the X-ray diagnostic imaging field, precision images (still images) or real-time image observation (moving images) are used where appropriate. When taking still images, an X-ray film is mainly used. On the other hand, when taking moving images, an image pickup tube (image intensifier) that combines a photo-multiplier tube and a CCD is used. While the X-ray film has a high spatial resolution, it has a low sensitivity and is capable of taking still images only. Further, the X-ray film requires a processing procedure after taking images and thus has a disadvantage of lack of immediacy. On the other hand, while the image pickup tube has a high sensitivity and is capable of taking moving images, it has a low spatial resolution. Further, the image pickup tube is a vacuum device and thus has a disadvantage of limits on upsizing.

There are two types of FPD: an indirect conversion type that converts an X-ray into light by a scintillator such as CsI and then converts the light into an electric charge by a photodiode, and a direct conversion type that converts an X-ray directly into an electric charge by an X-ray detector element such as Se. The indirect conversion type has a higher quantum efficiency and a better signal-to-noise ratio (S/N ratio), and is capable of visualization and imaging with a lower exposure dose compared to the direct conversion type. A structure and a manufacturing method related to an array substrate of the indirect conversion FPD have been disclosed in Japanese Unexamined Patent Application Publications Nos. 2000-101920 and 2007-165865, for example.

In the array substrate of the FPD, formation of a photodiode that affects the sensitivity of a photosensor, noise and so on is critical. For example, a photodiode in which an electrode made of a transparent conductive film is placed on an amorphous silicon layer, which is a photoelectric conversion layer, placed on an electrode, is disclosed in Japanese Unexamined Patent Application Publication No. 2000-101920. Further, a photodiode in which an insulating film is placed on a semiconductor layer, which is a photoelectric conversion layer, and a metal electrode is directly connected to the semiconductor layer through an opening of the insulating film is disclosed in Japanese Unexamined Patent Application Publication No. 2007-165865.

When forming a photodiode, the photodiode is damaged on its end face due to etching or the like of an amorphous silicon layer, which is a photoelectric conversion layer. Therefore, it is preferred to repair the damage on the end face of the photodiode by performing, after forming the photodiode, processing equal to plasma processing using hydrogen gas (which is referred to hereinafter as $H_2$ plasma processing) that is performed after back-channel etching of an inverse staggered amorphous TFT.

However, in the structure disclosed in Japanese Unexamined Patent Application Publication No. 2000-101920, the electrode placed on the amorphous silicon layer is made of a transparent conductive film, and the transparent conductive film is reduced by damage recovery processing on the end face of the photodiode. Therefore, damage recovery by $H_2$ plasma processing cannot be performed on the photodiode disclosed in Japanese Unexamined Patent Application Publication No. 2000-101920. This causes an increase in leakage current of the photodiode. This is because a leakage path is created in the damaged part of the end face of the photodiode upon application of a reverse bias to the transparent conductive film when using the photodiode as a sensor.

On the other hand, in the photodiode disclosed in Japanese Unexamined Patent Application Publication No. 2007-165865, no transparent conductive film is placed on the semiconductor layer, and therefore damage recovery by $H_2$ plasma processing can be performed. However, in the structure disclosed in Japanese Unexamined Patent Application Publication No. 2007-165865, if the insulating film of a coating type is formed by exposure, a leakage path is created on the end face of the photodiode by an impurity contained in the insulating film. On the other hand, if the insulating film is formed by deposition, not a coating type insulating film, damage is done to the semiconductor layer by dry etching upon making an opening in the insulating film. As a result, rectification at the p-i interface is degraded, which causes an increase in leakage current.

As described above, in the photosensor using the photodiode disclosed in Japanese Unexamined Patent Application Publications Nos. 2000-101920 and 2007-165865, the S/N ratio is deteriorated due to an increase in leakage current. It is thus impossible to obtain a suitable image with a small amount of incident light.

In view of the foregoing, it is desirable to provide a photoelectric conversion device that enables suppression of leakage current of a photodiode, and a method of manufacturing the same.

SUMMARY OF THE INVENTION

According to an embodiment of the present invention, there is provided a photoelectric conversion device which includes a thin film transistor placed on a substrate, a photodiode connected to a drain electrode of the thin film transistor and including an upper electrode, a lower electrode and a photoelectric conversion layer placed between the upper and lower electrodes, a first interlayer insulating film covering at least the upper electrode, a second interlayer insulating film placed in an upper layer of the first interlayer insulating film and covering the thin film transistor and the photodiode, and a line connected to the upper electrode through a contact hole disposed in the first interlayer insulating film and the second interlayer insulating film.

According to another embodiment of the present invention, there is provided a method of manufacturing a photoelectric conversion device which includes steps of forming a thin film transistor on a substrate, forming a photodiode connected to a drain electrode of the thin film transistor and including an upper electrode, a lower electrode and a photoelectric conversion layer between the upper and lower electrodes and a first interlayer insulating film covering at least the upper electrode, forming a second interlayer insulating film in an upper layer of the first interlayer insulating film so as to cover the thin film transistor and the photodiode, and forming a line connected to the upper electrode through a contact hole disposed in the first interlayer insulating film and the second interlayer insulating film.

According to the embodiments of the present invention described above, it is possible to provide a photoelectric conversion device that enables suppression of leakage current of a photodiode, and a method of manufacturing the same.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Preferred embodiments of the present invention will be described hereinbelow. The explanation provided hereinbelow merely illustrates the embodiments of the present invention, and the present invention is not limited to the below-described embodiments. The following description and the attached drawings are appropriately shortened and simplified to clarify the explanation. Further, the redundant explanation is omitted to clarify the explanation. In the figures, the identical reference symbols denote identical structural elements and the redundant explanation thereof is omitted.

First Embodiment

Figure 1:
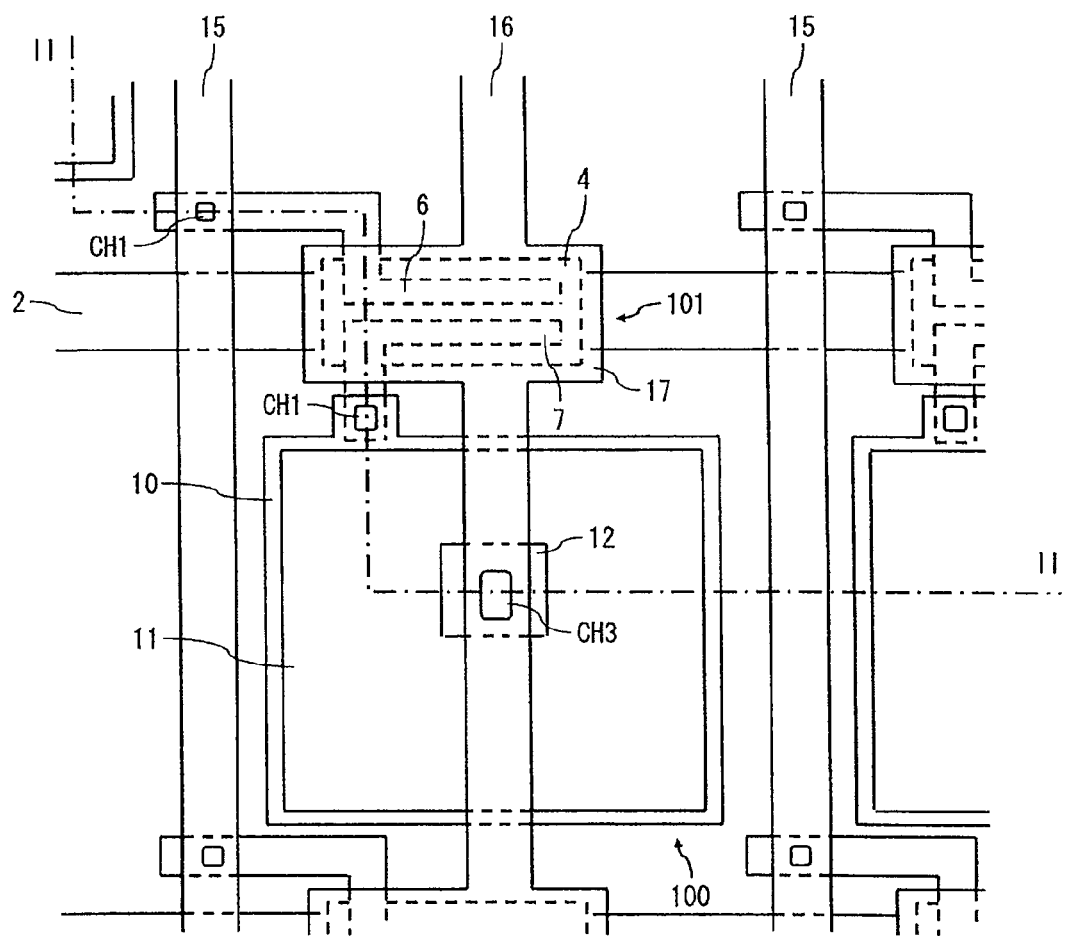
FIG. 1 is a plan view showing a structure of an array substrate used in a photoelectric conversion device according to a first embodiment.
Figure 2:
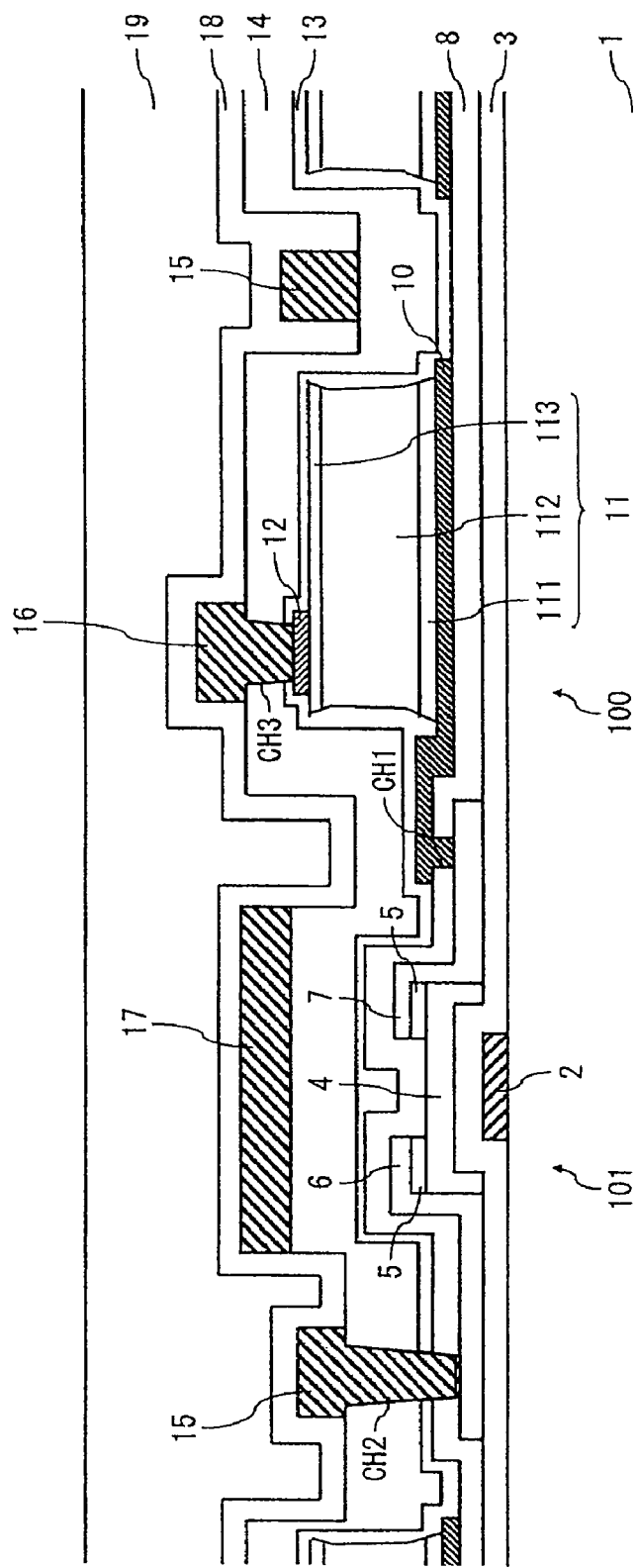
FIG. 2 is a cross-sectional view along line II-II in FIG. 1.

A photosensor (photoelectric conversion device) according to an embodiment of the present invention is described hereinafter with reference to FIGS. 1 and 2. FIG. 1 is a plan view showing a structure of an array substrate used in the photoelectric conversion device according to the first embodiment. FIG. 2 is a cross-sectional view along line II-II in FIG. 1.

On the array substrate, light receiving pixel areas are arranged in an array. FIG. 1 shows one of the light receiving pixel areas. In each light receiving pixel area, one photodiode 100 and one thin film transistor (TFT) 101 are placed as shown in FIGS. 1 and 2. Accordingly, on the array substrate, the photodiodes 100 and the TFTs 101 are arranged in an array.

Hereinafter, an area where the photodiodes 100 and the TFTs 101 are arranged in an array is referred to as an element area, and an area outside the element area is referred to as a peripheral area. For example, the element area is formed like a rectangular shape, and the peripheral area is formed like a frame shape. The peripheral area is placed outside terminals of lines placed in the element area. Thus, the element area is located at the center of the array substrate, and a terminal area where terminals of lines are placed is located outside the element area. Further, the peripheral area is located outside the terminal area.

In the element area, a plurality of gate lines 2 and a plurality of data lines 15 are placed. The plurality of gate lines 2 are arranged in parallel. The plurality of data lines 15 are also arranged in parallel. In FIG. 1, the gate line 2 extends in the crosswise direction, and the data line 15 extends in the lengthwise direction. In the gate line 2, a part that constitutes the TFT 101 serves as a gate electrode. The data line 15 is connected to a source electrode 6 of the TFT 101. The gate line 2 and the data line 15 intersect with each other with a gate insulating film 3 interposed therebetween.

The gate line 2 supplies a gate signal to the TFTs 101 that are arranged in a single horizontal row. The TFTs 101 in a single horizontal row thereby turn ON at the same time. The data line 15 sequentially reads data from a plurality of TFTs 101 that are arranged in a single vertical row. Each region partitioned by the adjacent gate lines 2 and the adjacent data lines 15 serves as the light receiving pixel area. Thus, the photoelectric conversion device is a two-dimensional array photodetector.

The gate line 2 is placed on a transparent insulating substrate 1 such a glass. The gate line 2 is made of a low resistance metal material containing a metal predominantly composed of aluminum (Al), with a thickness of 150 to 300 nm, for example. Use of the low resistance metal material reduces the resistance of the gate line 2 and thereby enables fabrication of a large-size photoelectric conversion device. As the metal predominantly composed of Al, an Al alloy containing Ni such as AlNiNd, AlNiSi or AlNiMg, which is an Al—Ni alloy, may be used. Another Al alloy may used as a matter of course. Further, as a material that can be used for the gate line 2, copper (Cu) or the like, which is also a low resistance metal material, may be used suitably in stead of Al. The gate line 2 is not limited to have a single layer structure of a low resistance metal material, and it may have a stacked structure of a low resistance metal material and another metal material. Although FIG. 2 shows the case where the end face of the gate line 2 is formed perpendicular to the substrate 1 by way of illustration, it is preferably formed in a tapered shape. This improves the coating property of a layer placed thereabove and thereby reduces the occurrence of a defect caused by disconnection or the like.

The gate insulating film 3 is placed to cover the gate line 2. The thickness of the gate insulating film 3 is 200 to 400 nm, for example. Although not shown, the gate insulating film 3 at the end of the substrate 1 is removed in the peripheral area located outside the terminal area.

On the gate insulating film 3, a semiconductor layer 4 is placed in the formation area of the TFT 101. Specifically, the semiconductor layer 4 is placed on the gate insulating film 3 so as to overlap with the gate line 2, and a part of the gate line 2 that overlaps with the semiconductor layer 4 serves as a gate electrode. The semiconductor layer 4 is formed in an island shape so as to face the gate electrode with the gate insulating film 3 interposed therebetween. For example, the semiconductor layer 4 is made of amorphous silicon to which hydrogen atom is added (which is referred to hereinafter as a-Si:H), with a thickness of 100 to 200 nm.

On both ends of the semiconductor layer 4, ohmic contact layers 5 doped with a conductive impurity are placed. Parts of the semiconductor layer 4 corresponding to the ohmic contact layers 5 serve as a source region and a drain region, respectively. Specifically, a part of the semiconductor layer 4 corresponding to the ohmic contact layer 5 on the left of FIG. 2 serves as a source region, and a part of the semiconductor layer 4 corresponding to the ohmic contact layer 5 on the right of FIG. 2 serves as a drain region. In this manner, the source region and the drain region are formed at both ends of the semiconductor layer 4. Further, a part between the source region and the drain region of the semiconductor layer 4 serves as a channel region. The ohmic contact layer 5 is not placed on the channel region of the semiconductor layer 4. For example, the ohmic contact layer 5 is made of a-Si:H into which n-type impurity such as phosphorous (P) is doped at high concentration (which is referred to hereinafter as n+a-Si:H), with a thickness of 20 to 50 nm. It is preferred that the end face of the part of the semiconductor layer 4 that forms the channel is formed in a tapered shape with respect to the substrate 1. This improves the coating property of a layer placed thereabove and thereby reduces the occurrence of a defect caused by disconnection or the like.

A source electrode 6 and a drain electrode 7 are placed on the ohmic contact layer 5. Specifically, the source electrode 6 is placed on the ohmic contact layer 5 on the source region side, and the drain electrode 7 is placed on the ohmic contact layer 5 on the drain region side. The source electrode 6 and the drain electrode 7 are connected to the semiconductor layer 4 through the ohmic contact layer 5. The channel-etch TFT 101 is configured in this manner. The TFT 101 is placed near the intersection of the gate line 2 and the data line 15. The source electrode 6 and the drain electrode 7 extend to the outside of the channel region of the semiconductor layer 4. Thus, like the ohmic contact layer 5, the source electrode 6 and the drain electrode 7 are not placed on the channel region of the semiconductor layer 4. For example, the source electrode 6 and the drain electrode 7 are made of a high melting point metal film such as Cr, with a thickness of 50 to 300 nm. A material that can be used for the source electrode 6 and the drain electrode 7 is not limited to a high melting point metal film such as Cr as long as it is a metal that can form ohmic contact with Si.

A first passivation film 8 is formed so as to cover the source electrode 6, the drain electrode 7 and the semiconductor layer 4. Thus, the TFT 101 is covered with the first passivation film 8. The first passivation film 8 has a contact hole CH1 that reaches the drain electrode 7. The first passivation film 8 is made of silicon oxide ($SiO_2$) with a thickness of 200 to 400 nm, for example. A material that can be used for the first passivation film 8 is not limited to $SiO_2$, and it may be SiN or SiON. Although not shown, the first passivation film 8 at the end of the substrate 1 is removed in the peripheral area located outside the terminal area.

Further, a photodiode 100 is placed on the first passivation film 8. The photodiode 100 is placed in each light receiving pixel area. The photodiode 100 includes a lower electrode 10, a photoelectric conversion layer 11 and an upper electrode 12.

The lower electrode 10 is placed on the first passivation film 8 so as to be connected with the drain electrode 7 through the contact hole CH1. The lower electrode 10 extends from the position above the drain electrode 7 to the inside of the light receiving pixel area. In this example, the lower electrode 10 having a substantially rectangular shape is placed at the center of the light receiving pixel area. The lower electrode 10 is electrically connected to the photoelectric conversion layer 11, which is described later, and functions as a cathode electrode of the photodiode 100. The lower electrode 10 is formed by a conductive thin film made of a high melting point metal film such as Cr, for example.

The photoelectric conversion layer 11 is placed on the lower electrode 10. The photoelectric conversion layer 11 is formed in a substantially rectangular shape at the center of the light receiving pixel area and functions as a light receiving pixel. In this example, the photoelectric conversion layer 11 that is smaller than the lower electrode 10 is placed inside the lower electrode 10 so as not to lie off the lower electrode 10. Thus, the photoelectric conversion layer 11 is located internally on the lower electrode 10. The photoelectric conversion layer 11 has a three-layer structure in which an n-type silicon (n-Si) film 111, an intrinsic silicon (i-Si) film 112 and a p-type silicon (p-Si) film 113 are sequentially stacked in this order from the substrate 1 side.

The n-Si film 111 is made of an amorphous silicon film into which n-type impurity such as phosphorous (P) is doped. The thickness of the n-Si film 111 is 5 to 100 nm, for example. The i-Si film 112 is made of an intrinsic amorphous silicon film. The thickness of the i-Si film 112 is 0.5 to 2.0 μm, for example. The p-Si film 113 is made of an amorphous silicon film into which p-type impurity such as boron (B) is doped. The thickness of the p-Si film 113 is 10 to 80 nm, for example.

Further, the upper electrode 12 is placed on the photoelectric conversion layer 11. The upper electrode 12 is electrically connected with the photoelectric conversion layer 11 and functions as an anode electrode of the photodiode 100. In this embodiment, the upper electrode 12 is made of a conductive thin film having a propensity that is not reduced by damage recovery processing on the side face of the photodiode, such as $H_2$ plasma processing. Preferably, the upper electrode 12 is made of a non-transparent conductive thin film made of a high melting point metal film such as Cr or its stacked film. In this embodiment, the upper electrode 12 is placed on only a part of the photoelectric conversion layer 11. The upper electrode 12 is formed to be slightly larger than a contact hole CH3, which is described later. Specifically, the upper electrode 12 has a pattern shape that is larger than an opening width of the contact hole CH3 by the size of a processing margin or larger. The thickness of the upper electrode 12 is 50 to 300 nm, for example. The photodiode 100 having such a structure converts received light into an electric charge.

A second passivation film 13 is placed to cover the upper electrode 12, the photoelectric conversion layer 11 and the lower electrode 10. In this embodiment, the second passivation film 13 is formed substantially all over the substrate 1 so as to cover the photodiode 100 and the TFT 101. The second passivation film 13 is made of a silicon nitride film with a thickness of 50 to 120 nm in order to suppress reflection from the surface of the photodiode 100. In this manner, by using an insulating film that is not a coating type as the second passivation film 13, it is possible to suppress leakage current of the photodiode 100. This is because, if the insulating film that is in contact with the photoelectric conversion layer 11 is a coating type, a leakage path is created on the end face of the photodiode due to an impurity contained in the insulating film.

Figure 3:
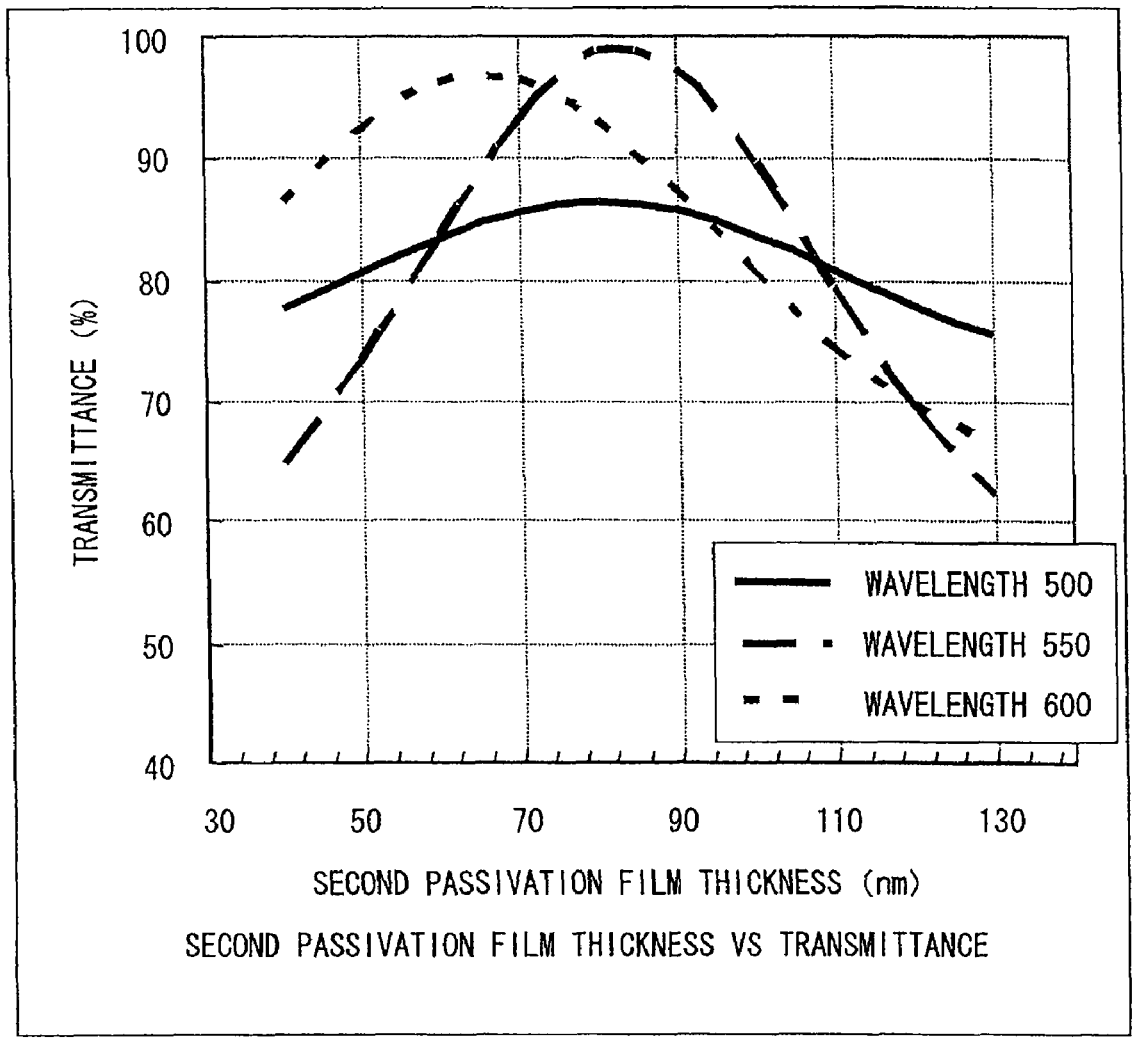
FIG. 3 is a graph showing a relationship between the thickness of a second passivation film and transmittance.

The thickness of the second passivation film 13 is preferably in the range of 70 nm±15 nm. The dependence of the transmittance on the thickness in the second passivation film 13 is described hereinafter with reference to FIG. 3. FIG. 3 is a graph showing a relationship between the thickness of the second passivation film 13 and the transmittance. FIG. 3 shows the transmittance at a wavelength of 500 nm, 550 nm and 600 nm when a third passivation film 14, a fourth passivation film 18 and a fifth passivation film 19, which are described later, are designed to have a given thickness. For example, it shows the values calculated based on the proportions of reflected light to incident light when the second passivation film 13, the third passivation film 14, the fourth passivation film 18 and the fifth passivation film 19 are formed on the p-Si film 113. As shown in FIG. 3, by designing the thickness of the second passivation film 13 to be within the range of 70 nm±15 nm (which is between 55 nm and 85 nm), it is possible to optimize the amount of light passing through the second passivation film 13. This enables a larger amount of light to reach the photodiode 100.

The third passivation film 14 is formed on the second passivation film 13. The third passivation film 14 is formed by a film in which a silicon oxide series insulating film is placed at least on the surface in contact with the second passivation film 13. Thus, the third passivation film 14 may have a single layer structure or a stacked structure as long as a silicon oxide series insulating film is placed at least on the surface in contact with the second passivation film 13. In the case of the stacked structure, for example, the third passivation film 14 may be a stacked film in which a silicon nitride film and a silicon oxide film are stacked on a silicon oxide series insulating film, such as a $SiO_2/SiN/SiO_2$ stacked film. Further, the third passivation film 14 may be a stacked film in which a transparent insulating film of a coating type such as a SOG film is stacked on a silicon oxide series insulating film. In this example, the third passivation film 14 is made of a silicon oxide film with a low permittivity with a thickness of 0.5 to 1.5 μm in order to reduce a load capacity on a bias line 16, which is described later, and the data line 15.

On the upper electrode 12, the contact hole CH3 that penetrates the second passivation film 13 and the third passivation film 14 is made. The contact hole CH3 is formed to be smaller than the upper electrode 12 in such a way that its bottom face is placed on the upper electrode 12. Thus, the contact hole CH3 is made in such a way that the pattern ends of the upper electrode 12 are covered with the second passivation film 13. Accordingly, the upper electrode 12 is surely located on the bottom face of the contact hole CH3. The upper electrode 12 is placed at least on the bottom face of the contact hole CH3. Further, on the source electrode 6, a contact hole CH2 that penetrates the first passivation film 8, the second passivation film 13 and the third passivation film 14 is made.

In this manner, the contact hole CH2 that reaches the source electrode 6 and the contact hole CH3 that reaches the upper electrode 12 are made both from the surface of the third passivation film 14. As shown in FIG. 2, the side faces of the contact holes CH2 and CH3 are preferably formed in a tapered shape with respect to the substrate 1. This improves the coating property of a layer placed thereabove and thereby reduces the occurrence of a defect caused by disconnection or the like.

On the third passivation film 14, the data line 15 that is connected to the source electrode 6 through the contact hole CH2 is placed. The data line 15 is a line for reading an electric charge that is converted in the photodiode 100.

Further, on the third passivation film 14, a bias line 16 that is connected to the upper electrode 12 through the contact hole CH3 is placed. The bias line 16 is formed in the same layer as the data line 15. The bias line 16 is electrically connected to the photoelectric conversion layer 11 through the upper electrode 12. The bias line 16 supplies a reverse bias to the photodiode 100 in order to make OFF state when no light is applied. The bias line 16 is formed to pass above the photodiode 100. Then, the bias line 16 intersects with the gate line 2 just like the data line 15, and is electrically connected to the bias line 16 of the adjacent light receiving pixel area at the outside of the element area. Thus, a plurality of bias lines 16 are placed in the element area. The plurality of bias lines 16 are arranged in parallel. The bias line 16 is placed between the adjacent data lines 15. The bias line 16 and the data line 15 are arranged substantially in parallel with each other.

Furthermore, on the third passivation film 14, a light shielding layer 17 for shielding the TFT 101 from light is placed. The light shielding layer 17 is placed above the TFT 101. The light shielding layer 17 is formed in the same layer as the data line 15 and the bias line 16. In this example, the light shielding layer 17 is formed by a wide part of the bias line 16. Thus, the bias line 16 is formed to be wide enough to cover the TFT 101 at the intersection with the gate line 2.

The data line 15, the bias line 16 and the light shielding layer 17 are made of a conductive film containing an Al alloy. Because an Al alloy containing Ni (Al—Ni alloy) has a low resistance, a high heat resistance and suitable contact properties with a conductive film, it is suitable for use as the conductive film that forms the data line 15 and the bias line 16. The data line 15, the bias line 16 and the light shielding layer 17 are made of AlNiNd with a thickness of 0.5 to 1.5 μm, for example. The data line 15, the bias line 16 and the light shielding layer 17 may be a single-layer film of an Al—Ni alloy or may be a stacked film in which an Al—Ni alloy film is formed at least in its top layer or bottom layer. For example, they may be a stacked film of AlNiNd and Mo or Mo alloy, or a high melting point metal such as Cr. In the case where the Al—Ni alloy film is placed in the top layer, a nitride layer may be further placed on its surface in order to suppress reaction with a developer. The light shielding layer 17 is not necessarily made of the same material as the bias line 16 as long as it can shield the TFT 101 from light.

Further, the fourth passivation film 18 is placed to cover the data line 15, the bias line 16 and the light shielding layer 17. The fourth passivation film 18 is made of SiN, for example. On the fourth passivation film 18, the fifth passivation film 19 is placed. The fifth passivation film 19 is a film with a flat surface, which is made of organic resin, for example.

In the photoelectric conversion device having the above structure, the anode of the photodiode 100 is connected to the bias line 16, and the cathode of the photodiode 100 is connected to the drain of the TFT 101. The source of the TFT 101 is connected to the data line 15, and the gate of the TFT 101 is connected to the gate line 2. The photodiode 100 converts received light into an electric charge. In this embodiment, the upper electrode 12 is placed only in the part of contact with the bias line 16, and incident light reaches the photoelectric conversion layer 11 in the part that does not overlap with the upper electrode 12 through the second passivation film 13. Therefore, with the structure of the connection part of the photodiode 100 with the bias line 16 according to the embodiment, it is possible to prevent reduction of an aperture ratio of the light receiving pixel. It is thereby possible to prevent reduction of a light receiving ratio of the photodiode 100. The data line 15 reads the converted electric charge from the photodiode 100 through the TFT 101. Specifically, the TFTs 101 are sequentially turned ON by a gate signal supplied to the gate line 2. The electric charge from each light receiving pixel is thereby read by the data line 15 through the TFTs 101.

The structure of the terminal area of the array substrate is described hereinafter with reference to FIGS. 4A, 4B, 5A and 5B. As mentioned above, the terminal area is located outside the element area where the photodiodes 100 and the TFTs 101 are arranged in an array. The gate line 2, the data line 15 and the bias line 16 are led to the outside of the element area, and their lead lines extend to the terminal area. In the terminal area, a gate terminal of the gate line 2, a data terminal of the data line 15 and a bias terminal of the bias line 16 are placed. Those terminals are formed in close proximity to the ends of the respective lead lines. Each terminal is exposed on the surface and connected to an external line. A short-circuit ring line may be placed on the outer side of each terminal.

Figure 4A:
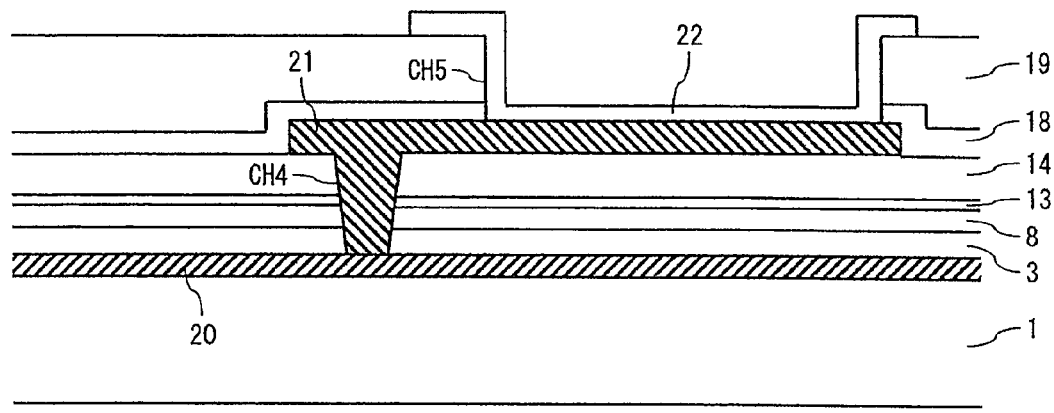
FIGS. 4A and 4B are cross-sectional views showing an exemplary structure of a terminal formed in a lead line of a gate line.

FIG. 4A is a cross-sectional view showing an exemplary structure of a terminal formed in a lead line of the gate line 2. In FIG. 4A, a lead line 20 is a line formed in the same layer as the gate line 2, and it is a lead line that extends from the gate line 2, for example. On the lead line 20, a contact hole CH4 that penetrates the gate insulating film 3, the first passivation film 8, the second passivation film 13 and the third passivation film 14 is made. Thus, the contact hole CH4 that reaches the lead line 20 is made from the surface of the third passivation film 14. A conductive pattern 21 that is connected to the lead line 20 through the contact hole CH4 is placed on the third passivation film 14. The conductive pattern 21 is formed in the same layer as the data line 15 and the bias line 16.

On the conductive pattern 21, a contact hole CH5 that penetrates the fourth passivation film 18 and the fifth passivation film 19 is made. A terminal lead electrode 22 that is connected to the conductive pattern 21 through the contact hole CH5 is placed on the fifth passivation film 19. The terminal lead electrode 22 is placed to cover the contact hole CH5. Thus, the terminal lead electrode 22 extends from the inside of the contact hole CH5 to the surface of the fifth passivation film 19. The terminal lead electrode 22 is electrically connected to the lead line 20 through the conductive pattern 21. Thus, the terminal lead electrode 22 functions as a terminal pad of the lead line 20. The terminal lead electrode 22 is placed in the terminal area and serves as a lead terminal for connecting each line to the outside.

Figure 4B:
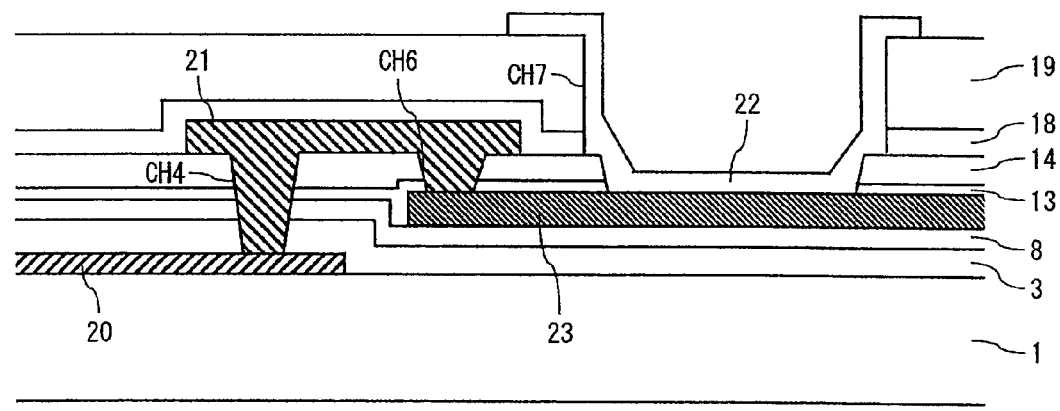

FIG. 4B is a cross-sectional view showing another exemplary structure of a terminal formed in a lead line of the gate line 2. In FIG. 4B, like FIG. 4A, on the lead line 20, the contact hole CH4 that penetrates the gate insulating film 3, the first passivation film 8, the second passivation film 13 and the third passivation film 14 is made. Thus, the contact hole CH4 that reaches the lead line 20 is made from the surface of the third passivation film 14.

In FIG. 4B, a short-circuit ring line 23 is placed on the first passivation film 8. The short-circuit ring line 23 is formed in the same layer as the upper electrode 12 of the photodiode 100. The short-circuit ring line 23 is located closer to the end of the substrate compared to the end of the lead line 20. The short-circuit ring line 23 is placed in the terminal area, for example. The short-circuit ring line 23 is connected to an external protection circuit or the like, which is not shown. The short-circuit ring line 23 is placed in order to protect the photoelectric conversion device by short-circuiting the line when overcurrent flows through the connected line, for example, in the manufacturing process or the like of the photoelectric conversion device. On the short-circuit ring line 23, a contact hole CH6 that penetrates the second passivation film 13 and the third passivation film 14 is made. Thus, the contact hole CH6 that reaches the short-circuit ring line 23 is made from the surface of the third passivation film 14.

The conductive pattern 21 is formed in the same layer as the data line 15 and the bias line 16 on the third passivation film 14. The conductive pattern 21 is connected to the lead line 20 through the contact hole CH4. The conductive pattern 21 is also connected to the short-circuit ring line 23 through the contact hole CH6. Thus, the short-circuit ring line 23 and the lead line 20 are electrically connected through the conductive pattern 21.

On the short-circuit ring line 23, a contact hole CH7 that penetrates the second passivation film 13, the third passivation film 14, the fourth passivation film 18 and the fifth passivation film 19 is made. Thus, the contact hole CH7 that reaches the short-circuit ring line 23 is made from the surface of the fifth passivation film 19. The terminal lead electrode 22 that is connected to the short-circuit ring line 23 through the contact hole CH7 is placed on the fifth passivation film 19. The terminal lead electrode 22 is placed to cover the contact hole CH7. Thus, the terminal lead electrode 22 extends from the inside of the contact hole CH7 to the surface of the fifth passivation film 19. The terminal lead electrode 22 is electrically connected to the lead line 20 through the short-circuit ring line 23 and the conductive pattern 21, and serves as a lead terminal for connecting the respective lines to the outside.

Figure 5A:
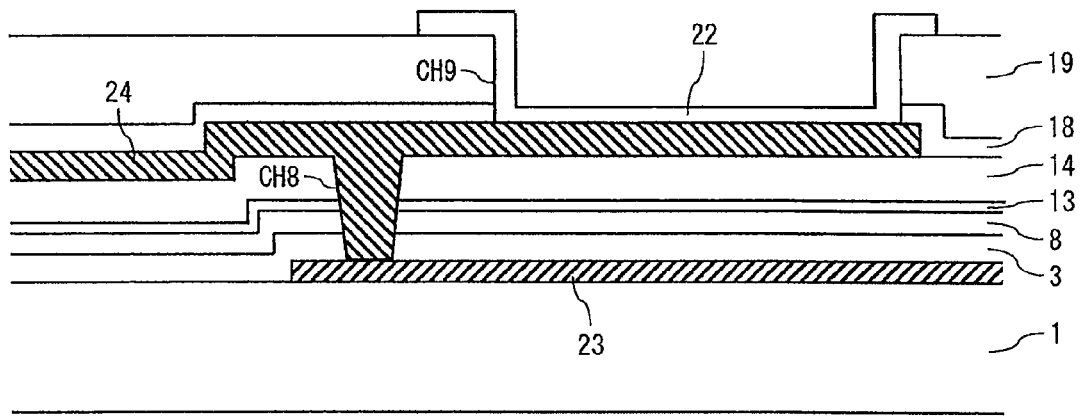
FIGS. 5A and 5B are cross-sectional views showing an exemplary structure of a terminal formed in a lead line of a data line and a bias line.

FIG. 5A is a cross-sectional view showing an exemplary structure of a terminal formed in a lead line of the data line 15 and the bias line 16. In FIG. 5A, the short-circuit ring line 23 is placed on the substrate 1. The short-circuit ring line 23 is formed in the same layer as the gate line 2. On the short-circuit ring line 23, a contact hole CH8 that penetrates the gate insulating film 3, the first passivation film 8, the second passivation film 13 and the third passivation film 14 is made. Thus, the contact hole CH8 that reaches the short-circuit ring line 23 is made from the surface of the third passivation film 14. On the third passivation film 14, a lead line 24 is placed. The lead line 24 is connected to the short-circuit ring line 23 through the contact hole CH8.

On the lead line 24, a contact hole CH9 that penetrates the fourth passivation film 18 and the fifth passivation film 19 is made. The terminal lead electrode 22 that is connected to the lead line 24 through the contact hole CH9 is placed on the fifth passivation film 19. The terminal lead electrode 22 is placed to cover the contact hole CH9. Thus, the terminal lead electrode 22 extends from the inside of the contact hole CH9 to the surface of the fifth passivation film 19. The terminal lead electrode 22 is connected to the lead line 24 through the contact hole CH9. Thus, the terminal lead electrode 22 is electrically connected to the short-circuit ring line 23 through the lead line 24. For example, the lead line 24 may be a lead line that extends from the data line 15 or the bias line 16. Further, the terminal lead electrode 22 may be a lead terminal of the short-circuit ring line 23 that is connected to the data line 15 or the bias line 16, for example.

Figure 5B:
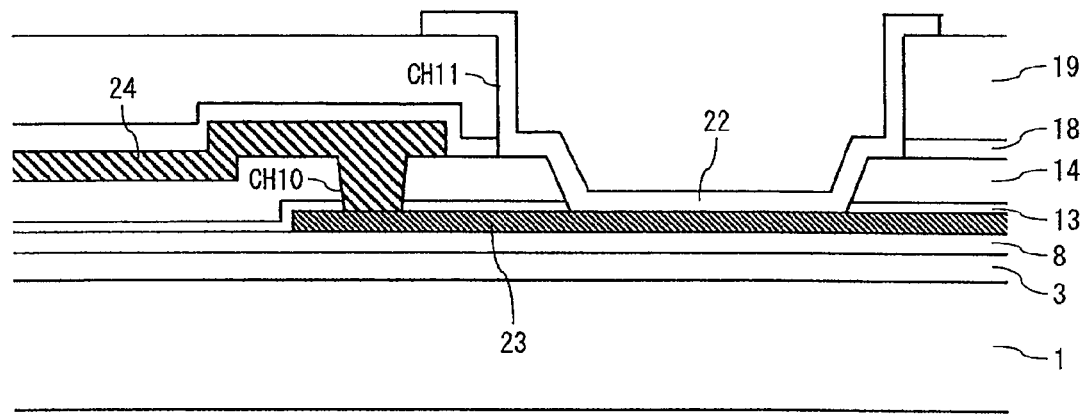

FIG. 5B is a cross-sectional view showing another exemplary structure of a terminal formed in a lead line of the data line 15 and the bias line 16. In FIG. 5B, the short-circuit ring line 23 is formed in a different line layer from that in FIG. 5A. As shown in FIG. 5B, the short-circuit ring line 23 is placed on the first passivation film 8. The short-circuit ring line 23 is formed in the same layer as the upper electrode 12. On the short-circuit ring line 23, a contact hole CH10 that penetrates the second passivation film 13 and the third passivation film 14 is made. Thus, the contact hole CH10 that reaches the short-circuit ring line 23 is made from the surface of the third passivation film 14. Further, a lead line 24 is placed on the third passivation film 14. The lead line 24 is connected to the short-circuit ring line 23 through the contact hole CH10. The short-circuit ring line 23 is located closer to the end of the substrate compared to the lead line 24.

Further, on the short-circuit ring line 23, a contact hole CH11 that penetrates the second passivation film 13, the third passivation film 14, the fourth passivation film 18 and the fifth passivation film 19 is made. The terminal lead electrode 22 that is connected to the lead line 24 through the contact hole CH11 is placed on the fifth passivation film 19. The terminal lead electrode 22 is placed to cover the contact hole CH11. Thus, the terminal lead electrode 22 extends from the inside of the contact hole CH11 to the surface of the fifth passivation film 19. The terminal lead electrode 22 is connected to the short-circuit ring line 23 through the contact hole CH11. Thus, the terminal lead electrode 22 is electrically connected to the lead line 24 through the short-circuit ring line 23. The lead line 24 may be a lead line that extends from the data line 15 or the bias line 16.

With use of the array substrate having the above structure, a photoelectric conversion device such as an X-ray imaging device can be manufactured by a known method. For example, the X-ray imaging device can be fabricated by depositing a scintillator that is made of CsI or the like and converts an X-ray into visible light on the fifth passivation film 19 and then connecting a digital board that includes a low noise amplifier, an A-D converter or the like, a driver board that drives the TFT 101 and a reading board that reads an electric charge.

A manufacturing method of the array substrate according to the first embodiment is described hereinafter with reference to FIGS. 6A to 6G. FIGS. 6A to 6G are cross-sectional views showing a manufacturing process of the array substrate according to the first embodiment. The cross-sectional views show the respective manufacturing steps corresponding to the parts shown in FIG. 2. The manufacturing process described hereinbelow is merely an example, and the present invention is not limited thereto.

First, a first conductive thin film is deposited on the substrate 1 by sputtering or the like. A metal predominantly composed of Al may be used as the first conductive thin film. For example, an Al alloy containing Ni (AlNiNd etc.) may be used. Deposition conditions are a pressure of 0.2 to 0.5 Pa and a DC power of 1.0 to 2.5 kW (or a power density of 0.17 to 0.43 W/cm$^2$), for example. A deposition temperature is in the range of a room temperature to about 180° C.

The thickness of the first conductive thin film is 150 to 300 nm. In order to suppress reaction with a developer, a nitride AlNiNdN layer may be formed on AlNiNd. Further, AlNiSi, AlNiMg or the like may be used in stead of AlNiNd. Further, Cu or an Cu alloy, which is a low resistance metal material, may be used rather than using an Al based film. In this case also, the film may be deposited by sputtering just like Al. In this embodiment, the first conductive thin film is not exposed when forming a photodiode. Therefore, a metal predominantly composed of Al or Cu, which is not highly resistant to damage, can be used as the first conductive thin film. A low resistance line can be thereby formed, which enables fabrication of a large-size photoelectric conversion device.

Next, a resist pattern for forming the gate line 2, the gate electrode and so on is formed by the first photolithography process. Then, in an etching process, the first conductive thin film is patterned by using mixed acid of phosphoric acid, nitric acid and acetic acid, for example, thereby forming the gate line 2, the gate electrode, the lead line 20 and so on. If the cross-sectional shape of the gate electrode is formed in a tapered shape, it is possible to reduce the occurrence of disconnection or the like in the subsequent film formation process. An etchant is not limited to mixed acid of phosphoric acid, nitric acid and acetic acid. Further, dry etching may be used in stead of wet etching.

Then, the gate insulating film 3, a material of the semiconductor layer 4 and a material of the ohmic contact layer 5 are deposited in this order so as to cover the gate line 2, the gate electrode, the lead line 20 and so on. They are formed all over the substrate 1 by plasma CVD or the like. The material of the semiconductor layer 4 may be a-Si:H, and the material of the ohmic contact layer 5 may be n+a-Si:H, for example. The gate insulating film 3 is deposited with a thickness of 200 to 400 nm, the film for the semiconductor layer 4 is deposited with a thickness of 100 to 200 nm, and the film for the ohmic contact layer 5 is deposited with a thickness of 20 to 50 nm.

The deposition temperature of those films is 250° to 350° C. For the photoelectric conversion device, high charge reading efficiency is required, and a transistor with high driving capacity is demanded. Therefore, the film for the semiconductor layer 4 may be deposited in two separate steps in order to enhance the performance of the transistor. As the deposition conditions in this case, a first layer is deposited with a low deposition rate of 5 to 20 nm/min (50 to 200 Å/min) to thereby form a high quality film, and the other layer is deposited with a deposition rate of 30 nm/min (300 Å/min) or higher.

Further, a resist pattern for obtaining a pattern of the semiconductor layer 4 is formed by the second photolithography process. Then, in an etching process, the film for the semiconductor layer 4 and the film for the ohmic contact layer 5 are patterned into an island shape. An island-shaped stacked layer pattern in which the film for the ohmic contact layer 5 is stacked on the semiconductor layer 4 is thereby formed. The etching is performed by using plasma with use of mixed gas of SF$_6$ and HCl, for example. If the cross-sectional shape of the channel is formed in a tapered shape, it is possible to reduce the occurrence of disconnection or the like in the subsequent film formation process. Although mixed gas of SF$_6$ and HCl is used as an example of etching gas, the present invention is not limited thereto.

Then, a resist pattern for making an opening only on the periphery of the substrate (not shown) is formed by the third photolithography process. The gate insulating film 3 in the peripheral area (not shown) on the substrate 1 is then removed by an etching process. In the etching, patterning is performed by using plasma of mixed gas of CF$_4$ and O$_2$, for example. The etching gas, however, is not limited thereto.

After that, a second conductive thin film for forming the source electrode 6 and the drain electrode 7 is deposited. The second conductive thin film is formed by depositing a high melting point metal film such as Cr with use of sputtering or the like. The thickness of the second conductive thin film is 50 to 300 nm. A material that can be used as the second conductive thin film is not limited to a high melting point metal film as long as it is a metal that can form ohmic contact with Si.

Figure 6A:
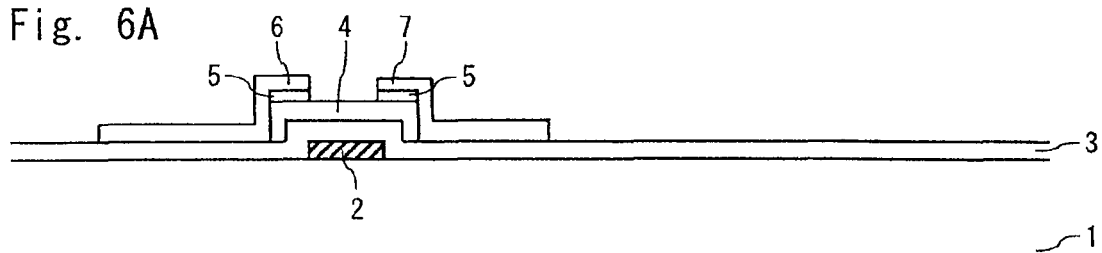
FIGS. 6A to 6G are cross-sectional views showing a manufacturing process of the array substrate according to the first embodiment.

Then, a resist pattern for forming the source electrode 6 and the drain electrode 7 is formed by the fourth photolithography process. Then, in an etching process, the second conductive thin film is patterned by using mixed acid of ceric ammonium nitrate and nitric acid, for example. The source electrode 6 and the drain electrode 7 are thereby formed. After that, the film for the ohmic contact layer 5 is etched by using plasma with use of mixed gas of $SF_6$ and HCl, for example, using the formed electrode as a mask. The part of the film for the ohmic contact layer 5 patterned in an island shape which is not covered with the source electrode 6 or the drain electrode 7 and exposed is thereby removed by etching. As a result, the semiconductor layer 4 and the ohmic contact layer 5 in which the channel region is formed between the source electrode 6 and the drain electrode 7 are formed as shown in FIG. 6A.

Although the photolithography process is performed four times up to this step, multi-tone exposure may be used in the second and fourth photolithography processes that form the silicon island and the channel etch of the source electrode 6, the drain electrode 7 and the ohmic contact layer 5. The multi-tone exposure is an exposure technique that uses a gray-tone mask, a half-tone mask or the like. By using the multi-tone exposure technique, it is possible to form the pattern of the source electrode 6, the drain electrode 7, the semiconductor layer 4 and the ohmic contact layer 5 in one-time photolithography process. This enables reduction of the number of masks to be used.

Although mixed acid of ceric ammonium nitrate and nitric acid is taken as an example of an etchant for forming the source electrode 6 and the drain electrode 7, and mixed gas of $SF_6$ and HCl is taken as an example of etching gas of the ohmic contact layer 5, the etchant and the etching gas are not limited thereto. Further, in order to improve the TFT characteristics, plasma processing using hydrogen gas may be performed before forming the first passivation film 8, which is described later, for roughing of the back channel, which is the surface of the semiconductor layer 4. The TFT 101 is thereby formed by the above-described process.

Next, the first passivation film 8 is deposited by plasma CVD or the like. As the first passivation film 8, a silicon oxide ($SiO_2$) film with a low permittivity is formed with a thickness of 200 to 400 nm. Deposition conditions of the silicon oxide film are a $SiH_4$ flow rate of $1.69\times10^{-2}$ to $8.45\times10^{-2}$ $Pa\cdot m^3/s$ (10 to 50 sccm), an $N_2O$ flow rate of $3.38\times10^{-1}$ to $8.45\times10^{-1}$ $Pa\cdot m^3/s$ (200 to 500 sccm), a deposition pressure of 50 Pa, and an RF power of 50 to 200 W (or a power density of 0.015 to 0.67 $W/cm^2$). A deposition temperature is 200° to 300° C.

Figure 6B:
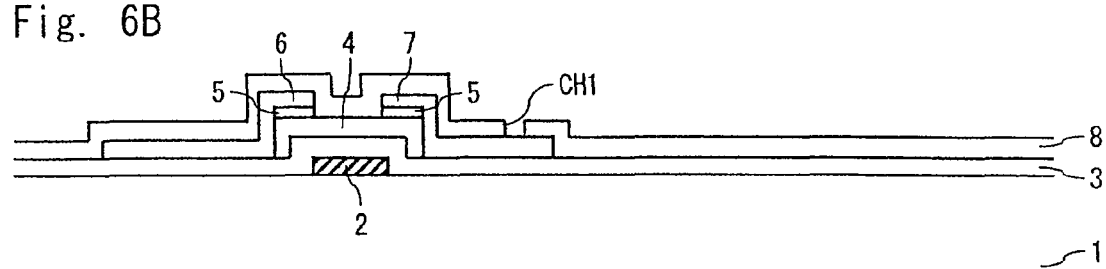

Then, by the fifth photolithography process and the etching process, the contact hole CH1 for allowing contact between the drain electrode 7 and the lower electrode 10 is made. In the etching, plasma of mixed gas of $CF_4$ and $O_2$ may be used, for example. The structure shown in FIG. 6B is thereby formed.

Although mixed gas of $CF_4$ and $O_2$ is taken as an example of etching gas, the kind of etching gas is not limited thereto. Further, although silicon oxide is taken as an example of the first passivation film 8, it is not limited thereto. For example, SiN or SiON may be used as the first passivation film 8, which is made by adding hydrogen, nitrogen and $NH_3$ to the above gas.

After that, a third conductive thin film to serve as the lower electrode 10 of the photodiode 100 is deposited by sputtering or the like. As the third conductive thin film, a high melting point metal film such as Cr may be used.

Next, the n-type silicon film 111, the intrinsic silicon film 112 and the p-type silicon film 113 for forming the photoelectric conversion layer 11 are deposited by plasma CVD. Specifically, an n-type a-Si film which is a p-doped amorphous silicon film is deposited as the n-type silicon film 111, an i-type a-Si film which is non-doped amorphous silicon film is deposited as the intrinsic silicon film 112, and a p-type a-Si film which is a B-doped amorphous silicon film is deposited as the p-type silicon film 113 sequentially while maintaining a vacuum state. The thickness of the n-type silicon film 111 is preferably 5 to 60 nm, the thickness of the intrinsic silicon film 112 is preferably 0.5 to 2.0 μm, and the thickness of the p-type silicon film 113 is preferably 10 to 80 nm.

Deposition of the intrinsic silicon film 112 is performed under setting with an $SiH_4$ flow rate of $1.69\times10^{-1}$ to $3.38\times10^{-1}$ $Pa\cdot m^3/s$ (100 to 200 sccm), an $H_2$ flow rate of $1.69\times10^{-1}$ to $5.07\times10^{-1}$ $Pa\cdot m^3/s$ (100 to 300 sccm), a deposition pressure of 100 to 300 Pa, an RF power of 30 to 150 W (or a power density of 0.01 to 0.05 $W/cm^2$), and a deposition temperature of 200° to 300° C., for example. Deposition of the n-type silicon film 111 is performed with use of deposition gas in which $PH_3$ at 0.2% to 1.0% is mixed with gas under the above deposition conditions. Deposition of the p-type silicon film 113 is performed with use of deposition gas in which $B_2H_6$ at 0.2% to 1.0% is mixed with gas under the above deposition conditions.

The p-type silicon film 113 may be formed by introducing B into an upper layer part of the intrinsic silicon film 112 by ion shower doping or ion implantation. In the case of forming the p-type silicon film 113 by ion implantation, a $SiO_2$ film with a thickness of 5 to 40 nm may be formed on the surface of the intrinsic silicon film 112 before forming the p-type silicon film 113. This reduces damage when implanting B. In this case, the $SiO_2$ film may be removed by BHF or the like after ion implantation.

After that, a fourth conductive thin film for forming the upper electrode 12 is deposited. In this embodiment, as the fourth conductive thin film, a film having a property that is not reduced by damage recovery processing on the side face of the photodiode, such as $H_2$ plasma processing, is formed. In this example, a non-transparent conductive thin film made of a high melting point metal film such as Cr is deposited all over the substrate 1 by using sputtering, for example. The thickness of the fourth conductive thin film is 50 to 300 nm. It is preferred to perform deposition of the fourth conductive thin film under the condition of not heating the substrate.

Figure 6C:
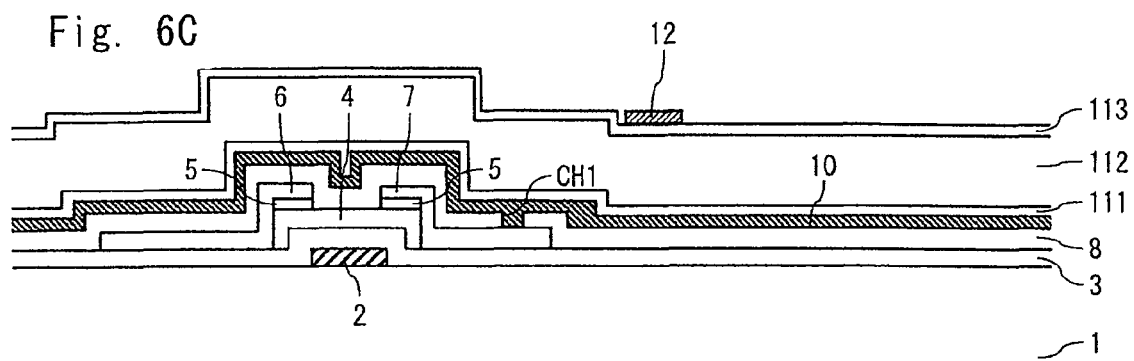

After depositing the fourth conductive thin film, a resist pattern for obtaining the upper electrode 12 is formed by the sixth photolithography process. Then, the fourth conductive thin film is patterned by etching. The upper electrode 12 that is larger than the contact hole CH3, which is made in the second passivation film 13 by the subsequent process, by the size of a processing margin or larger is thereby formed as shown in FIG. 6C.

Next, a resist pattern for obtaining the photoelectric conversion layer 11 is formed by the seventh photolithography process. Then, the amorphous silicon layer, which is three layers of the n-type silicon film 111, the intrinsic silicon film 112 and the p-type silicon film 113, is patterned by using plasma of mixed gas of $SF_6$ and HCl. The photoelectric conversion layer 11 having a three-layer stacked structure is thereby formed. Although mixed gas of $SF_6$ and HCl is taken as an example of etching gas, it is not limited thereto, and other etching gas may be also used suitably.

Figure 6D:
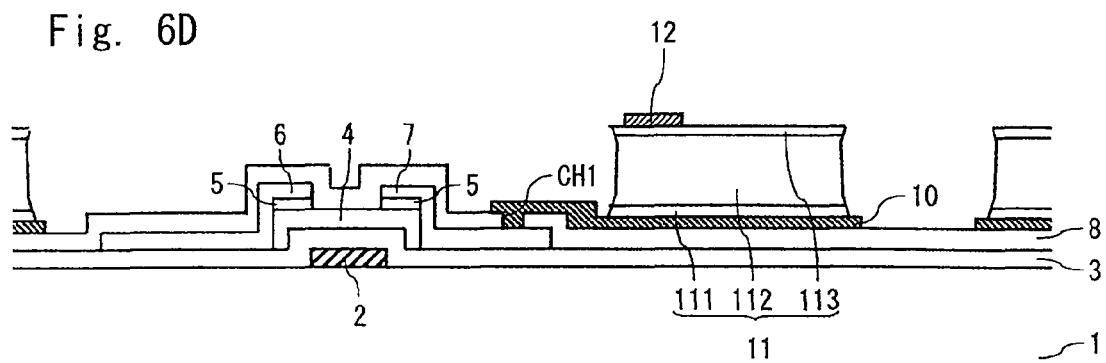
Figure 6E:
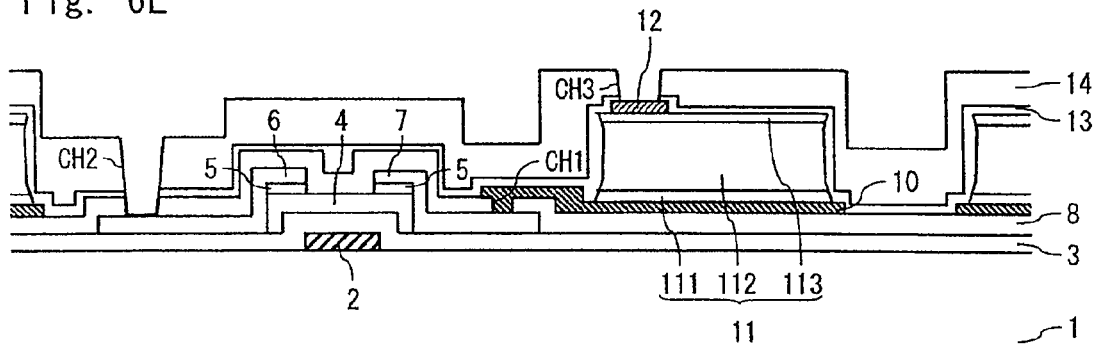

Further, a resist pattern that is slightly larger than the pattern of the photoelectric conversion layer 11 is formed by the eighth photolithography process, and the third conductive thin film is patterned. The lower electrode 10 is thereby formed as shown in FIG. 6D. The photodiode 100 is formed by the above-described process.

After that, processing for recovering damage on the side face of the photodiode 100 is performed. In this example, plasma processing using $H_2$ gas is performed. Because the upper electrode 12 is made of a conductive thin film that is not reduced by damage recovery processing on the side face of the photodiode in this embodiment, it is possible to recover damage on the side face of the photodiode 100 for sure without reduction of the upper electrode 12. Although processing using $H_2$ plasma is taken as an example, it is not limited thereto. For example, plasma processing using gas that enables damage recovery on the side face of the photodiode and blocking of a leakage path may be performed. Further, as wet processing, BHF, HF processing, or cleaning processing such as removal of extraneous matter or foreign matter on the side face of the photodiode by remote plasma, alkaline chemical or the like may be performed.

Then, the second passivation film 13 and the third passivation film 14 for protecting the photodiode 100 are deposited in this order. The second passivation film 13 is made of a silicon nitride film with a thickness of 50 to 120 nm in order to suppress reflection from the surface of the photodiode 100. Preferably, the thickness of the second passivation film 13 is in the range of 70±15 nm. The third passivation film 14 is made of a silicon oxide film with a low permittivity with a large thickness of 0.5 to 1.5 μm in order to reduce a load capacity on the data line 15 and the bias line 16 by using CVD, sputtering or the like. Deposition conditions of the silicon oxide film are a $SiH_4$ flow rate of $1.69 \times 10^{-2}$ to $8.45 \times 10^{-2}$ Pa·m³/s (10 to 50 sccm) an $N_2O$ flow rate of $3.38 \times 10^{-1}$ to $8.45 \times 10^{-1}$ Pa·m³/s (200 to 500 sccm) a deposition pressure of 50 Pa, an RF power of 50 to 200 W (or a power density of 0.015 to 0.67 W/cm²) and a deposition temperature of 200° to 300° C.

Although the silicon oxide film is taken as an example of the material of the third passivation film 14, it is not limited thereto. The third passivation film 14 may have either a single layer structure or a stacked structure as long as a silicon oxide series insulating film is placed at least on the surface in contact with the second passivation film 13. For example, as the third passivation film 14, a stacked film in which a silicon nitride film and a silicon oxide film are stacked on a silicon oxide series insulating film, such as a $SiO_2/SiN/SiO_2$ stacked film, may be formed. Further, the third passivation film 14 may be a stacked film in which a transparent insulating film of a coating type such as a SOG film is stacked on a silicon oxide series insulating film.

After that, a resist pattern corresponding to the contact hole CH2 for allowing connection between the source electrode 6 and the data line 15 and the contact hole CH3 for allowing connection between the upper electrode 12 and the bias line 16 is formed by the ninth photolithography process. Then, the contact holes CH2 and CH3 are made by using plasma with use of mixed gas of $CF_4$ and Ar.

In this step, the contact hole CH3 having a smaller opening width than a pattern size of the upper electrode 12 is made in this embodiment. The upper electrode 12 is thereby exposed on the bottom of the contact hole CH3, and the photoelectric conversion layer 11 is not exposed inside the contact hole CH3. If the semiconductor layer (p-Si film 113) constituting the photoelectric conversion layer 11 is etched when making the contact hole CH3, rectification at the i-p interface is degraded, which causes an increase in leakage current. In this embodiment, because the upper electrode 12 is placed at the opening of the contact hole CH3, the p-Si film 113 is protected by the upper electrode 12 when making the contact hole CH3. It is thereby possible to prevent damage on the photoelectric conversion layer 11 on the anode electrode side that constitutes the photodiode 100. This suppresses leakage current of the photodiode 100.

In this step, the contact holes CH4, CH6, CH8 and CH10 at the end of the substrate are also made at the same time (c.f. FIGS. 4A, 4B, 5A and 5B). Further, if the contact holes are formed to have a tapered cross section, the coating property of a layer placed thereabove is improved, which reduces the occurrence of disconnection or the like.

After that, a fifth conductive thin film is deposited for forming the data line 15, the bias line 16, the light shielding layer 17 and the conductive pattern 21. As the fifth conductive thin film, an Al alloy containing Ni that has a low resistance, a high heat resistance and suitable contact properties with a conductive thin film is deposited. For example, AlNiNd is deposited with a thickness of 0.5 to 1.5 μm as the fifth conductive thin film. The fifth conductive thin film may be a single layer film of AlNiNd. Alternatively, the fifth conductive thin film may be a stacked film of AlNiNd and Mo or Mo alloy, or a high melting point metal such as Cr. Further, a nitride AlNiNdN may be formed on top of AlNiNd in order to suppress reaction with a developer. For example, an Mo alloy is deposited as a base and AlNiNd is deposited thereon in succession by sputtering or the like. Deposition conditions are a pressure of 0.2 to 0.5 Pa and a DC power of 1.0 to 2.5 kW (or a power density of 0.17 to 0.43 W/cm²) for example. A deposition temperature is in the range of a room temperature to about 180° C.

Figure 6F:
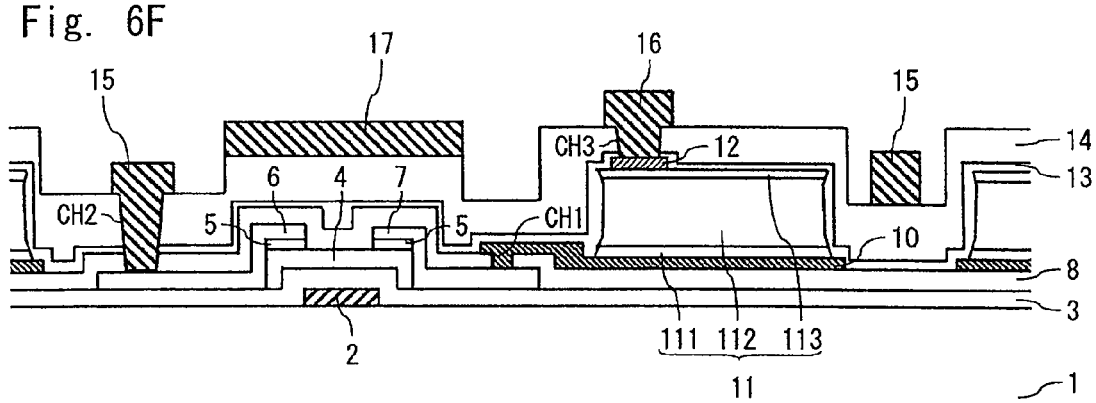

Then, a resist corresponding to the data line 15, the bias line 16, the light shielding layer 17 and the conductive pattern 21 is formed by the tenth photolithography process. In the case of a stacked film of AlNiNd and Mo, patterning is performed by using mixed acid of phosphoric acid, nitric acid and acetic acid, for example. Although mixed acid of phosphoric acid, nitric acid and acetic acid is taken as an example of etchant, the kind of etchant is not limited thereto. As a result, the data line 15 that is physically and electrically connected to the source electrode 6 and the bias line 16 that is physically and electrically connected to the upper electrode 12 are formed as shown in FIG. 6F. At the same time, the light shielding layer 17 is formed above the TFT 101, and the conductive pattern 21 is formed in the terminal area.

After that, the fourth passivation film 18 and the fifth passivation film 19 are formed to protect the data line 15 and the bias line 16. For example, SiN is used for the fourth passivation film 18, and a planarized film is used for the fifth passivation film 19. The structure shown in FIG. 6G is thereby formed.

Figure 6G:
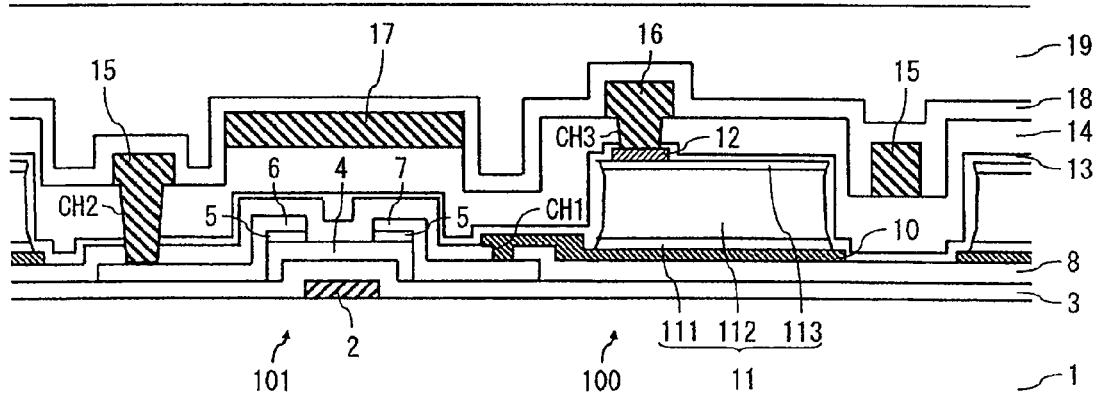

After that, a resist pattern for making the contact holes CH5, CH7, CH9 and CH11 for establishing connection with the terminal is formed in the terminal area by the eleventh photolithography process, although not shown in FIG. 6G. Then, patterning is performed by using plasma of mixed gas of $CF_4$ and $O_2$. Although mixed gas of $CF_4$ and $O_2$ is taken as an example of etching gas, the etching gas to be used is not limited thereto. As the fifth passivation film 19, a photosensitive planarized film may be used. Patterning of the fifth passivation film 19 in the eleventh photolithography process may be thereby performed by exposure and development processing.

Then, a conductive film to serve as the terminal lead electrode 22 is deposited. In order to ensure reliability, a transparent conductive thin film such as amorphous ITO, for example, is deposited as the electrode material. Next, a resist in a terminal shape is formed by the twelfth photolithography process. For example, the terminal lead electrode 22 is formed by performing etching with use of oxalic acid. After that, the amorphous ITO is crystallized by annealing in the terminal lead electrode 22. The terminal lead electrode 22 that is connected to the conductive pattern 21, the short-circuit ring line 23 or the lead line 24 through either one of the contact holes CH5, CH7, CH9 and CH11 is thereby formed as shown in FIGS. 4A, 4B, 5A and 5B. Although the transparent conductive thin film is used as the terminal lead electrode 22, the terminal lead electrode 22 may have a two-layer structure of a conductive thin film suitable for establishing favorable contact with the conductive pattern 21 and a transparent conductive thin film. The array substrate of the embodiment is thereby completed by the above-described process.

As described above, in this embodiment, the upper electrode 12 is made of a conductive thin film that is not reduced by damage recovery processing on the side face of the photodiode 100. It is thereby possible to reliably remove contamination or the like during damage recovery on the side face of the photodiode 100 or photodiode formation without reduction of the upper electrode 12 due to the damage recovery processing. This suppresses leakage current of the photodiode 100. Further, this achieves stable connection between the bias line 16 and the photodiode 100, thus providing a device with low $I_{off}$. Consequently, it is possible to provide a high quality photoelectric conversion device.

Further, an interlayer insulating film that is placed between the photodiode 100 and the bias line 16 has a multilayer structure of the second passivation film 13 (first interlayer insulating film) and the third passivation film 14 (second interlayer insulating film), and silicon nitride is used for the second passivation film 13 that is in direct contact with the photoelectric conversion layer 11. By using an insulating film that is not a coating type as the part of direct contact with the photoelectric conversion layer 11, it is possible to prevent a leakage path from being created on the end face of the photodiode due to an impurity contained in the insulating film. This further suppresses leakage current of the photodiode 100. Further, when making the contact hole CH3 for allowing connection between the photodiode 100 and the bias line 16, the surface of the photoelectric conversion layer 11 is protected by the upper electrode 12, and it is thereby possible to prevent damage on the p-Si film 113. This further suppresses leakage current of the photodiode 100.

As described above, with the structure of the connection part of the photodiode 100 with the bias line 16 according to the embodiment, it is possible to effectively suppress leakage current of the photodiode and thereby provide a large-size photoelectric conversion device with a suitable S/N ratio. It is further possible to provide a suitable image with a small amount of incident light. It is thereby possible to provide a high quality photoelectric conversion device.

Although the case of removing the gate insulating film 3 on the periphery of the substrate by using the pattern of the third photolithography process is described by way of illustration in the embodiment, the present invention is not limited thereto. For example, the gate insulating film 3 on the periphery may be removed after forming the source electrode 6 and the drain electrode 7. Alternatively, the ohmic contact layer 5, the semiconductor layer 4 and the gate insulating film 3 on the periphery of the substrate may be removed at the same time after depositing the ohmic contact layer 5. Further, the first passivation film 8 and the gate insulating film 3 may be removed in the process of making the contact hole CH1. In this case, it is preferred to use etching conditions that reduce dry etching damage on the drain electrode 7.

Second Embodiment

Figure 7:
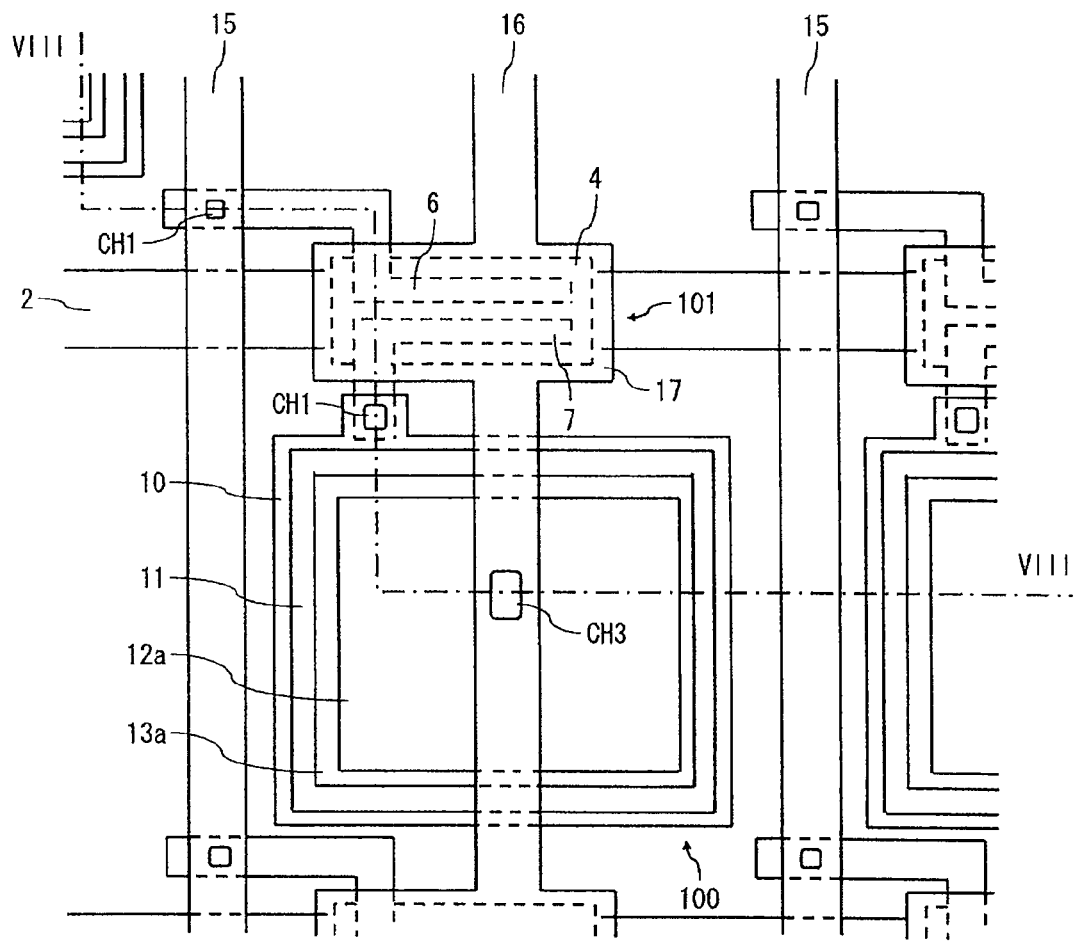
FIG. 7 is a plan view showing a structure of an array substrate used in a photoelectric conversion device according to a second embodiment.
Figure 8:
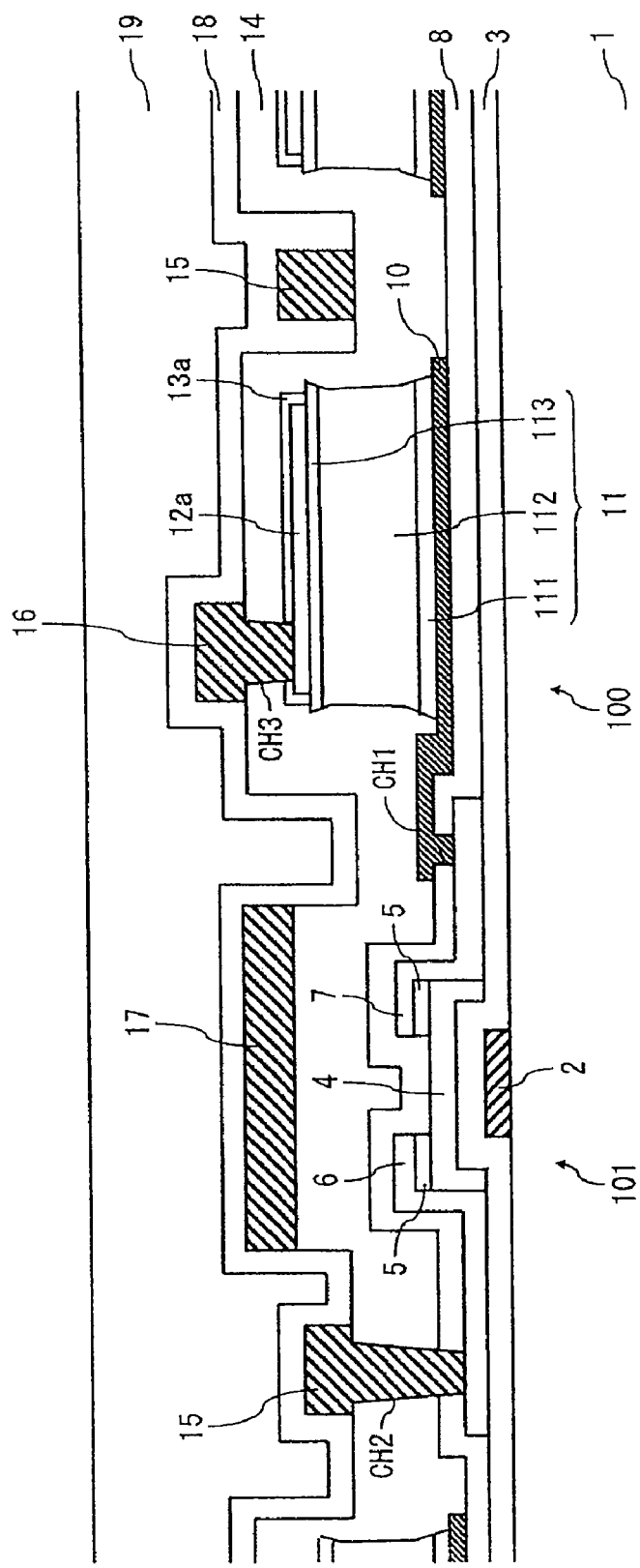
FIG. 8 is a cross-sectional view along line VIII-VIII in FIG. 7.

A photosensor (photoelectric conversion device) according to a second embodiment of the present invention is described hereinafter with reference to FIGS. 7 and 8. FIG. 7 is a plan view showing a structure of an array substrate used in the photoelectric conversion device according to the second embodiment. FIG. 8 is a cross-sectional view along line VIII-VIII in FIG. 7. In this embodiment, an upper electrode and a second passivation film that are different from those of the first embodiment are formed. The other structure is substantially the same as that of the first embodiment and thus not redundantly explained below.

Referring to FIGS. 7 and 8, in this embodiment, an upper electrode 12*a* made of a transparent conductive film is placed on the photoelectric conversion layer 11. The upper electrode 12*a* is formed in the most part on the photoelectric conversion layer 11. In this example, the upper electrode 12*a* that is slightly smaller than the photoelectric conversion layer 11 is formed.

Further, a second passivation film 13*a* is placed on the upper electrode 12*a*. In this embodiment, the second passivation film 13*a* is placed only in the part on the photoelectric conversion layer 11 in the element area. In this example, the second passivation film 13*a* that is larger than the upper electrode 12*a* and smaller than the top face of the photoelectric conversion layer 11 is formed. Thus, the second passivation film 13*a* is placed to cover at least the upper electrode 12*a* on the photoelectric conversion layer 11. Further, the third passivation film 14 is formed to cover the photodiode 100 on which the second passivation film 13*a* is placed in the upper layer. The third passivation film 14 is formed substantially all over the substrate 1.

The upper electrode 12*a* and the bias line 16 are connected through the contact hole CH3 that penetrates the second passivation film 13*a* and the third passivation film 14. The bias line 16 is electrically connected to the photoelectric conversion layer 11 through the upper electrode 12*a*. Further, the source electrode 6 and the data line 15 are connected through the contact hole CH2 that penetrates the first passivation film 8 and the third passivation film 14. Although not shown in FIGS. 7 and 8, the second passivation film 13*a* in the terminal area may be formed in the same manner as in the first embodiment shown in FIGS. 4A, 4B, 5A and 5B, or may not be formed.

A manufacturing method of the array substrate according to the second embodiment is described hereinafter with reference to FIGS. 9A to 9H. FIGS. 9A to 9H are cross-sectional views showing a manufacturing process of the array substrate according to the second embodiment. The cross-sectional views show the respective manufacturing steps corresponding to the parts shown in FIG. 8. The manufacturing process described hereinbelow is merely an example, and the present invention is not limited thereto. In this embodiment, a formation step of the photodiode 100 and a formation step of the interlayer insulating film placed between the photodiode 100 and the bias line 16 are different from those of the first embodiment. The other steps are the same as those of the first embodiment and not redundantly explained.

Figure 9A:
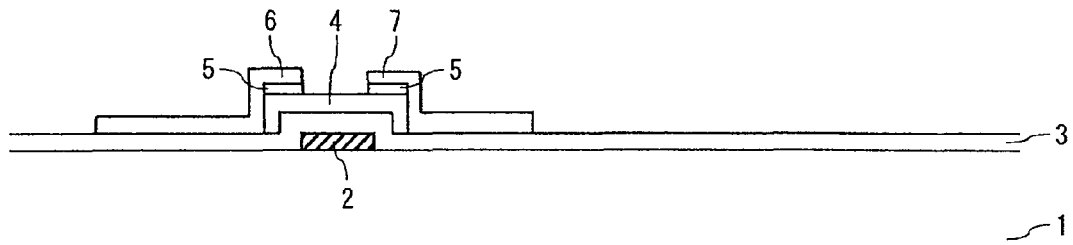
FIGS. 9A to 9H are cross-sectional views showing a manufacturing process of the array substrate according to the second embodiment.
Figure 9B:
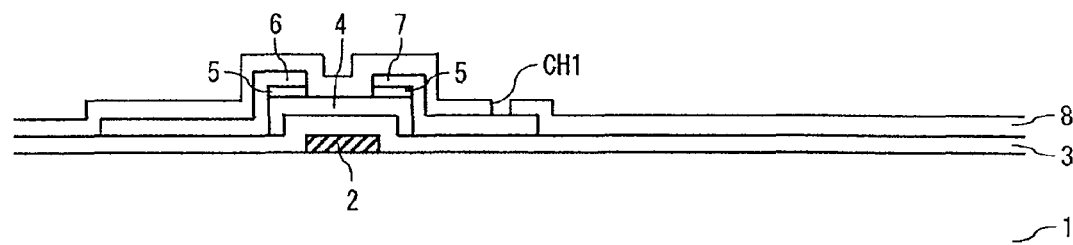

First, in the same manner as in the first embodiment, the TFT 101 is formed (FIG. 9A) and the first passivation film 8 is formed thereon (FIG. 9B). Next, on the first passivation film 8, the third conductive thin film that serves as the lower electrode 10 of the photodiode 100 is deposited as in the first embodiment. Further, the n-type silicon film 111, the intrinsic silicon film 112 and the p-type silicon film 113 for forming the photoelectric conversion layer 11 are deposited thereon in the same manner as in the first embodiment.

Next, in this embodiment, the fourth conductive thin film for forming the upper electrode 12a is deposited. As the fourth conductive thin film, an amorphous transparent conductive film is deposited by sputtering with use of a target such as IZO, ITZO or ITSO. Deposition conditions are a pressure of 0.3 to 0.6 Pa, a DC power of 3 to 10 kW (or a power density of 0.65 to 2.3 W/cm$^2$), an Ar flow rate of $8.45 \times 10^{-2}$ to $25.4 \times 10^{-2}$ Pa·m$^3$/s (50 to 150 sccm), and an oxygen flow rate of $1.69 \times 10^{-3}$ to $3.38 \times 10^{-3}$ Pa·m$^3$/s (1 to 2 sccm). A deposition temperature is from a room temperature to about 180° C. The amorphous transparent conductive film is deposited under the above conditions.

Figure 9C:
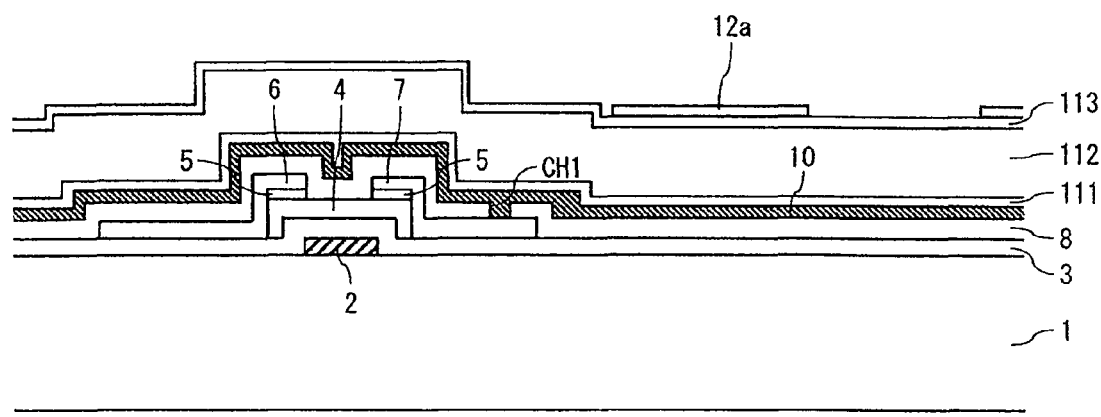

Then, a resist pattern for obtaining the upper electrode 12a is formed by the sixth photolithography process. Etching is then performed by using oxalic acid, and the fourth conductive thin film is patterned. The upper electrode 12a is thereby formed as shown in FIG. 9C. An etchant is not limited to oxalic acid.

In this embodiment, because the transparent conductive film such as IZO, ITZO or ITSO is used as the upper electrode 12a, it can be deposited in an amorphous state where minute crystal grains are hardly contained on the p-type silicon film 113 in the lower layer. This has an effect that etching residue is not generated. The upper electrode 12a may be formed by a film deposited with a target of mixture of indium oxide (In$_2$O$_3$), zinc oxide (ZnO), tin oxide (SnO$_2$), samarium oxide (Sm$_2$O$_3$) or the like, or a stacked film of those materials. Further, films containing mixture of those materials may be stacked.

Then, the second passivation film 13a for protecting the upper electrode 12a is deposited.

Figure 9D:
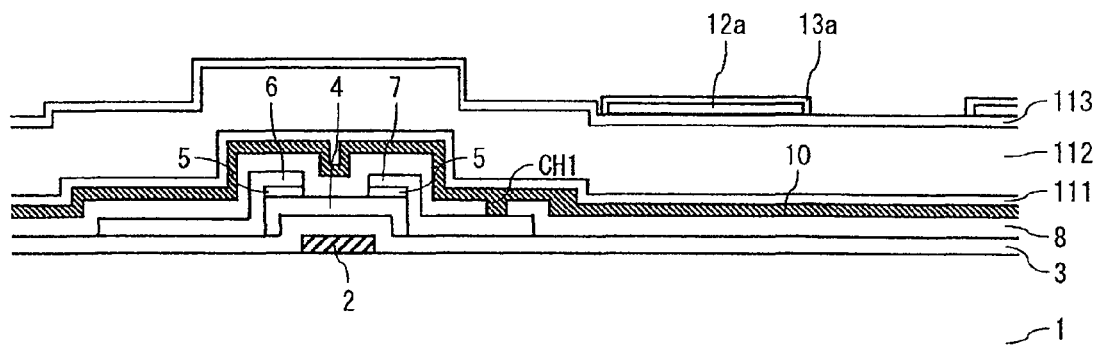

After that, a resist pattern that is larger than the upper electrode 12a and smaller than the photoelectric conversion layer 11 to be formed in the subsequent step is formed by the seventh photolithography process. Then, the second passivation film 13a is patterned by using plasma with use of mixed gas of CF$_4$ and Ar. The second passivation film 13a is thereby formed only in the part that covers the upper electrode 12a in the element area as shown in FIG. 9D.

Next, a resist pattern for obtaining the photoelectric conversion layer 11 is formed by the eighth photolithography process. Then, the amorphous silicon layer, which is three layers of the n-type silicon film 111, the intrinsic silicon film 112 and the p-type silicon film 113, is patterned by using plasma of mixed gas of SF$_6$ and HCl. The photoelectric conversion layer 11 having a three-layer stacked structure is thereby formed. Although mixed gas of SF$_6$ and HCl is taken as an example of etching gas, it is not limited thereto, and other etching gas may be also used suitably.

Figure 9E:
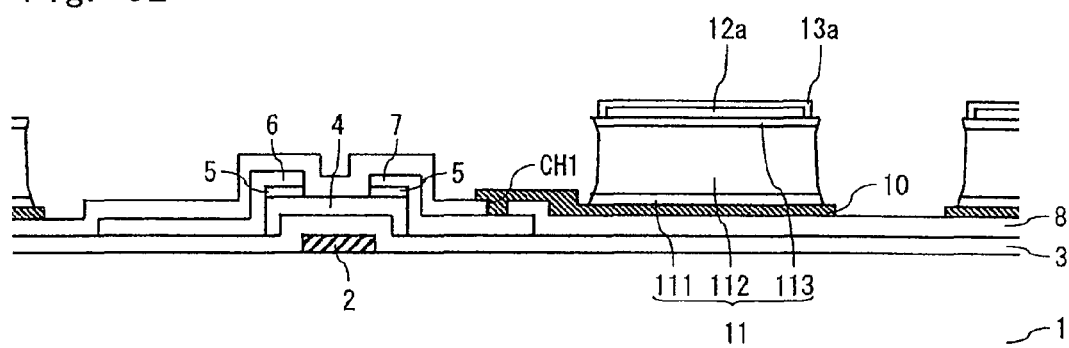

Further, a resist pattern that is slightly larger than the pattern of the photoelectric conversion layer 11 is formed by the ninth photolithography process, and the third conductive thin film is patterned. The lower electrode 10 is thereby formed as shown in FIG. 9E. The photodiode 100 is formed by the above-described process.

After that, processing for recovering damage on the side face of the photodiode 100 is performed. In this example, plasma processing using H$_2$ gas is performed. In this embodiment, although the upper electrode 12a is made of a transparent conductive film that is reduced by damage recovery processing on the side face of the photodiode, because it is completely protected with the second passivation film 13a, it is possible to recover damage on the side face of the photodiode 100 for sure without reduction. By forming the upper electrode 12a with a transparent conductive film, it is possible to improve an aperture ratio of the light receiving pixel. Although processing using H$_2$ plasma is taken as an example, it is not limited thereto. For example, plasma processing using gas that enables damage recovery on the side face of the photodiode and blocking of a leakage path may be performed. Further, as wet processing, BHF, HF processing, or cleaning processing such as removal of extraneous matter or foreign matter on the side face of the photodiode by remote plasma, alkaline chemical or the like may be performed.

Further, the third passivation film 14 for protecting the photodiode 100 is deposited. The third passivation film 14 is made of a silicon oxide film with a low permittivity with a large thickness of 0.5 to 1.5 μm in order to reduce a load capacity on the data line 15 and the bias line 16 by using CVD, sputtering or the like. Deposition conditions of the silicon oxide film are a SiH$_4$ flow rate of $1.69 \times 10^{-2}$ to $8.45 \times 10^{-2}$ Pa·m$^3$/s (10 to 50 sccm), an N$_2$O flow rate of $3.38 \times 10^{-1}$ to $8.45 \times 10^{-1}$ Pa·m$^3$/s (200 to 500 sccm), a deposition pressure of 50 Pa, an RF power of 50 to 200 W (or a power density of 0.015 to 0.67 W/cm$^2$) and a deposition temperature of 200° to 300° C.

Although the silicon oxide film is taken as an example of the material of the third passivation film 14, it is not limited thereto. The third passivation film 14 may have either a single layer structure or a stacked structure as long as a silicon oxide series insulating film is placed at least on the surface in contact with the second passivation film 13a. For example, as the third passivation film 14, a stacked film in which a silicon nitride film and a silicon oxide film are stacked on a silicon oxide series insulating film, such as a SiO$_2$/SiN/SiO$_2$ stacked film, may be formed. Further, the third passivation film 14 may be a stacked film in which a transparent insulating film of a coating type such as a SOG film is stacked on a silicon oxide series insulating film.

After that, a resist pattern corresponding to the contact hole CH2 for allowing connection between the source electrode 6 and the data line 15 and the contact hole CH3 for allowing connection between the upper electrode 12a and the bias line 16 is formed by the tenth photolithography process. Then, the contact holes CH2 and CH3 are made by using plasma with use of mixed gas of CF$_4$ and Ar.

Figure 9F:
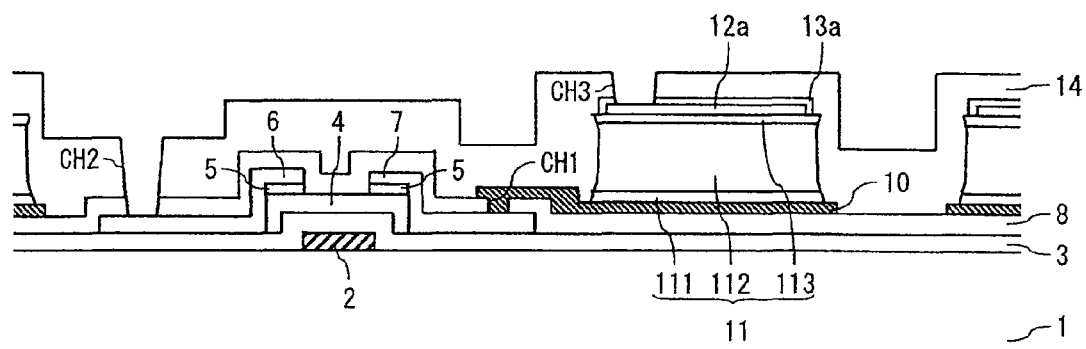

In this embodiment, because the upper electrode 12a is placed at the opening of the contact hole CH3, the p-Si film 113 is protected by the upper electrode 12a when making the contact hole CH3. It is thereby possible to prevent damage on the photoelectric conversion layer 11 on the anode electrode side that constitutes the photodiode 100. This suppresses leakage current of the photodiode 100. The structure shown in FIG. 9F is thereby formed.

The subsequent steps are the same as those in the first embodiment and thus not redundantly described in detail. In sum, the data line 15, the bias line 16, the light shielding layer 17 and the conductive pattern 21 are formed on the third passivation film 14 in the same manner as in the first embodiment. However, in this embodiment, the photolithography process (the seventh photolithography process) for patterning the second passivation film 13a into a different shape from the third passivation film 14 is added to the process of the first embodiment. Therefore, the photolithography process for forming the data line 15, the bias line 16, the light shielding layer 17 and the conductive pattern 21 (which corresponds to the tenth photolithography process in the first embodiment) is the eleventh photolithography process in this embodiment.

Figure 9G:
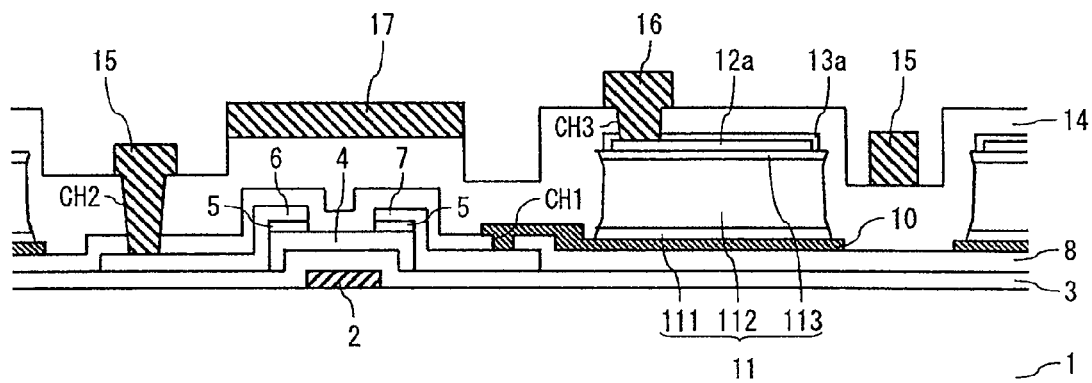

The data line 15, the bias line 16, the light shielding layer 17 and the conductive pattern 21 are thereby formed as shown in FIG. 9G.

Figure 9H:
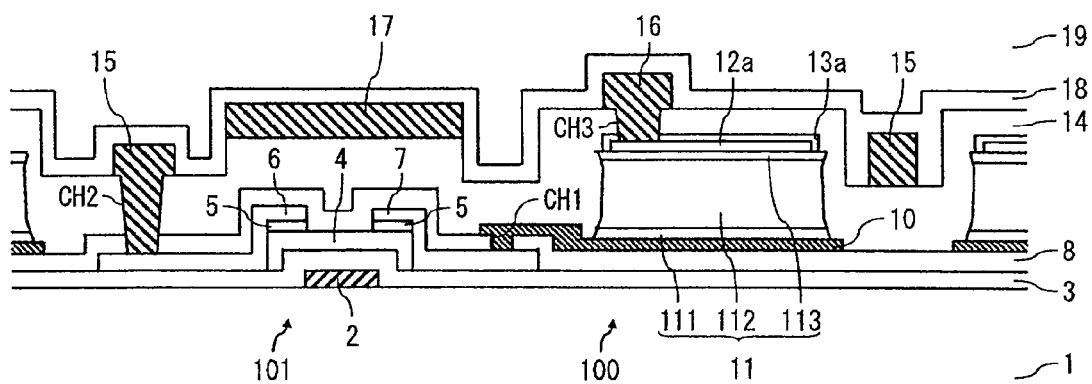

After that, in the same manner as in the first embodiment, the fourth passivation film 18 and the fifth passivation film 19 are formed, and the contact holes CH5, CH7, CH9 and CH11 for establishing connection with the terminal are formed. The photolithography process performed in this step (which corresponds to the eleventh photolithography process in the first embodiment) is the twelfth photolithography process in this embodiment. Then, the terminal lead electrode 22 is formed in the same manner as in the first embodiment. The photolithography process performed in this step (which corresponds to the twelfth photolithography process in the first embodiment) is the thirteenth photolithography process in this embodiment. The array substrate of the embodiment shown in FIG. 9H is thereby completed by the above-described process.

Although the patterning of the second passivation film 13a shown in FIG. 9D and the patterning of the photoelectric conversion layer 11 shown in FIG. 9E are performed by separate photolithography processes in the above description, they may be performed in one-time photolithography process. In this case, the resist pattern that is used in the patterning of the second passivation film 13a is used also in the patterning of the photoelectric conversion layer 11. The seventh photo lithography process and the eighth photolithography process can be thereby integrated into one-time photolithography process, which enables reduction of the number of masks to be used.

Figure 10:
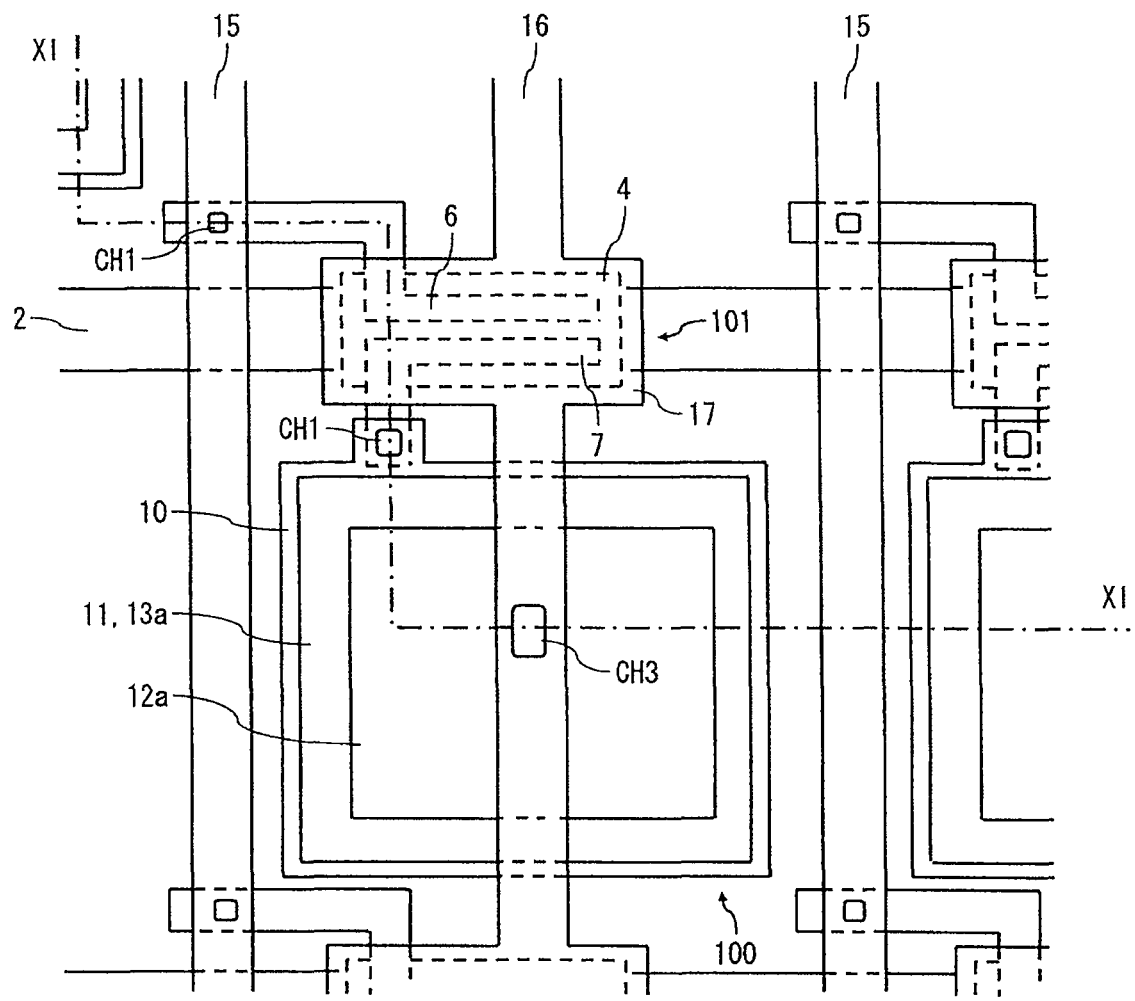
FIG. 10 is a plan view showing a structure of an array substrate according to another example of the second embodiment.
Figure 11:
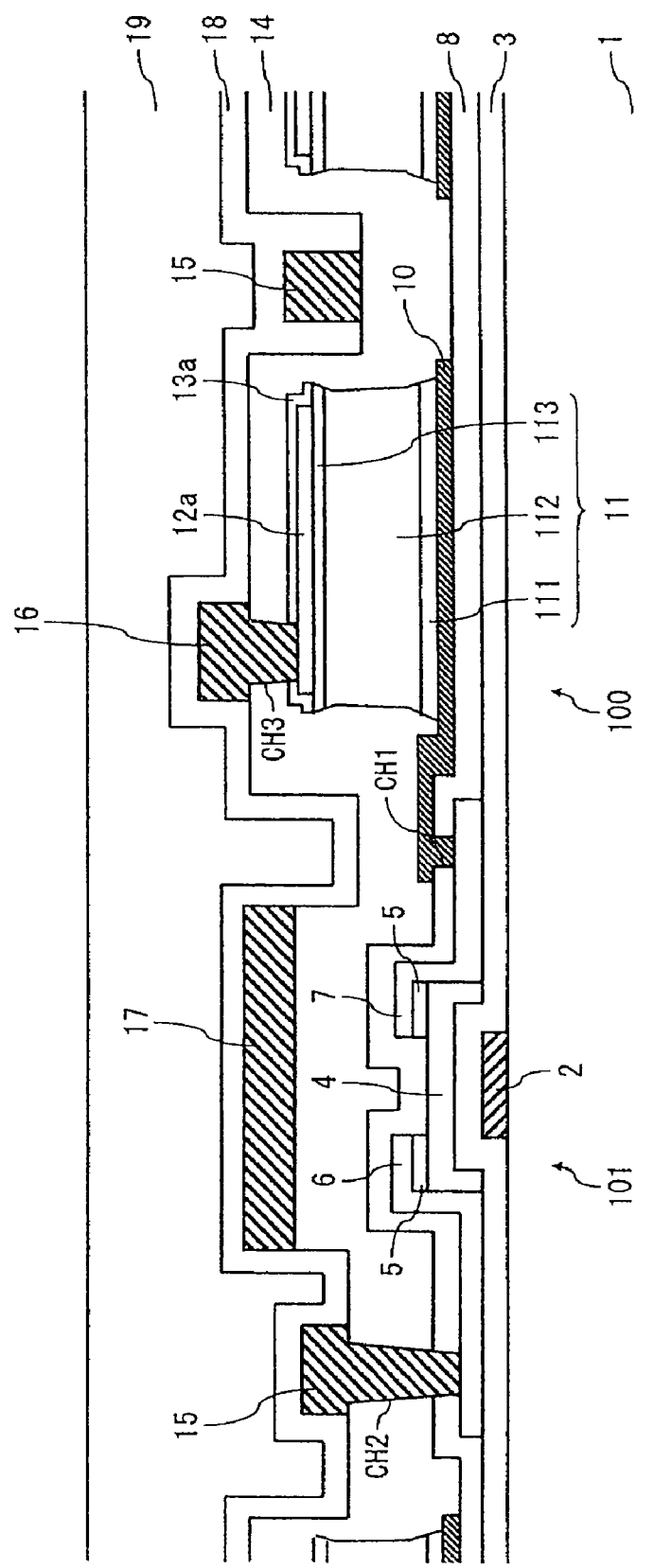
FIG. 11 is a cross-sectional view along line XI-XI in FIG. 10.

The array substrate fabricated in this process is described hereinafter with reference to FIGS. 10 and 11. FIG. 10 is a plan view showing a structure of an array substrate according to another example of the second embodiment, and FIG. 11 is a cross-sectional view along line XI-XI in FIG. 10. By patterning the second passivation film 13a and the photoelectric conversion layer 11 with use of the same resist pattern, the photoelectric conversion layer 11 of substantially the same size as the pattern of the second passivation film 13a is formed as shown in FIGS. 10 and 11. Accordingly, the top face of the photoelectric conversion layer 11 is covered with the second passivation film 13a of the same size as the top face of the photoelectric conversion layer 11. It is thereby possible to prevent damage at the end of the top face of the photodiode 100 or adherence of foreign matter.

Figure 12:
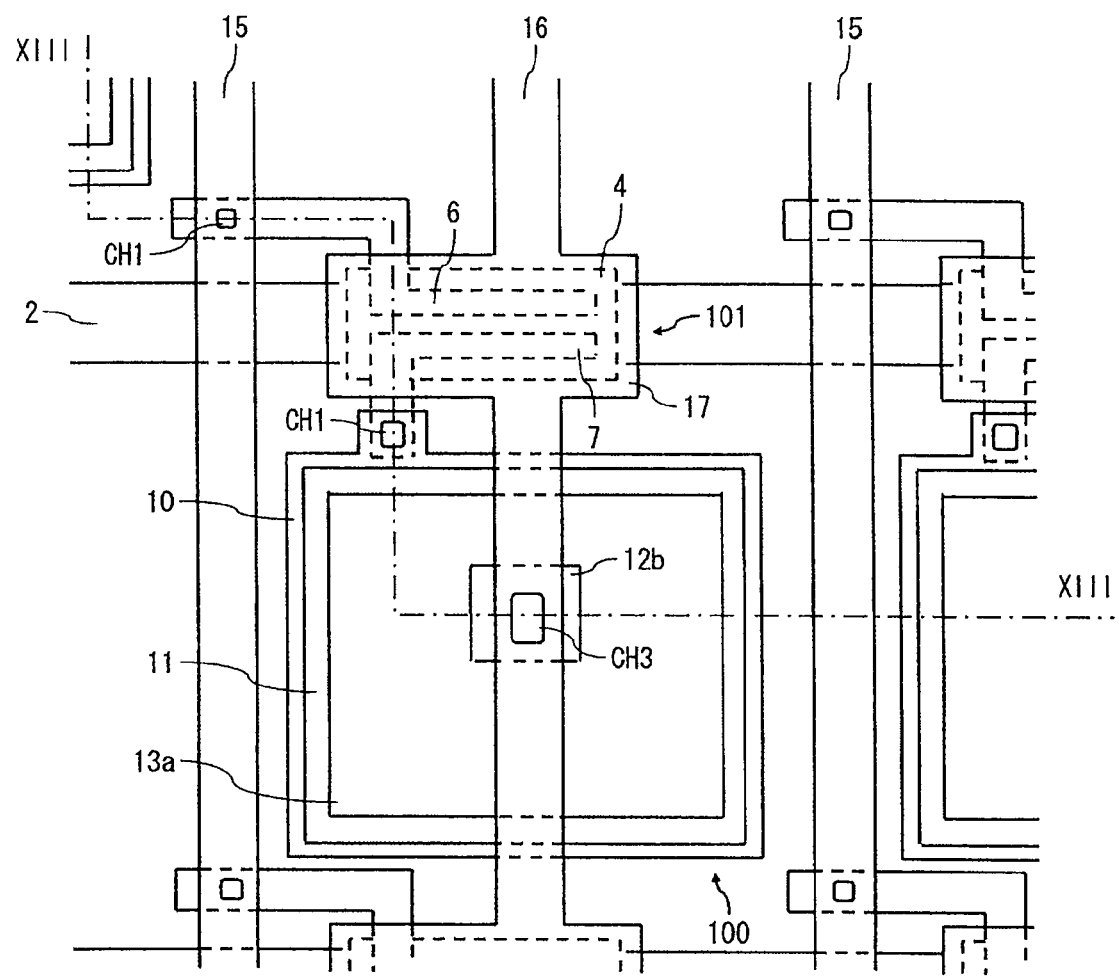
FIG. 12 is a plan view showing a structure of an array substrate according to yet another example of the second embodiment.
Figure 13:
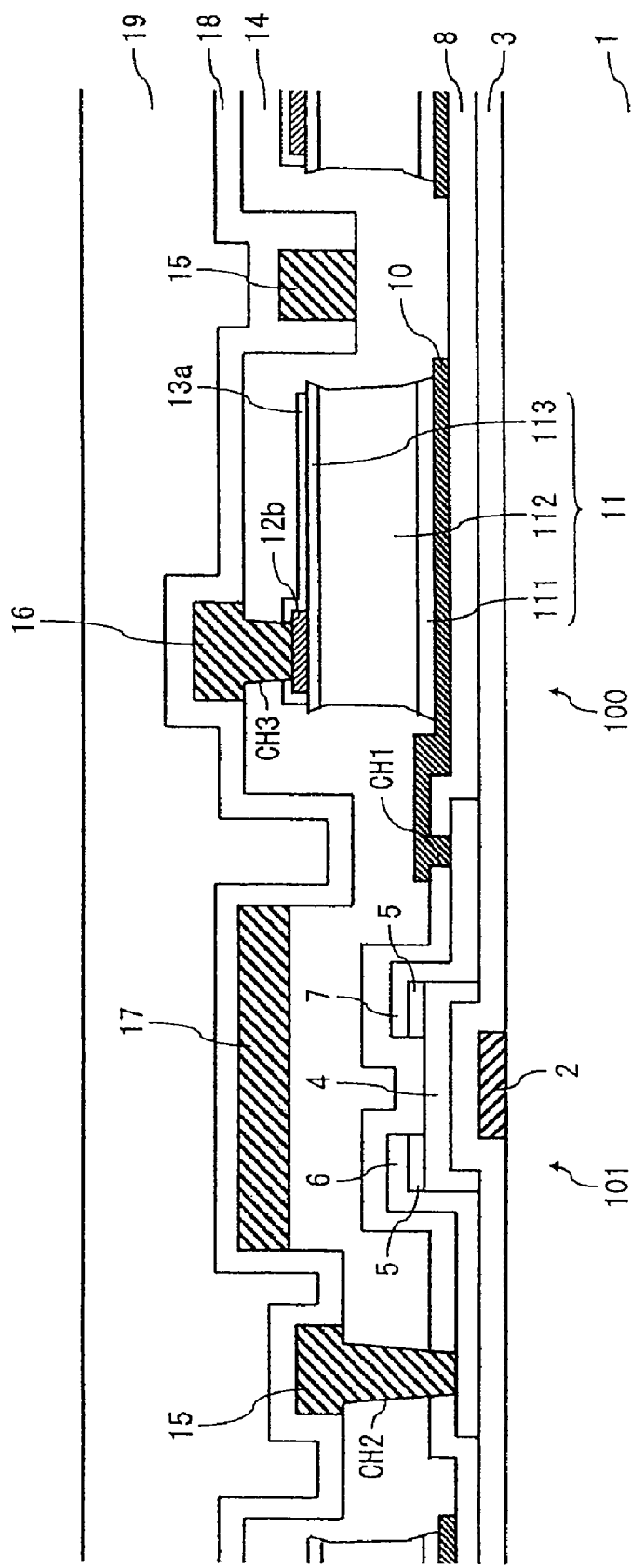
FIG. 13 is a cross-sectional view along line XIII-XIII in FIG. 12.

FIG. 12 is a plan view showing a structure of an array substrate according to yet another example of the second embodiment, and FIG. 13 is a cross-sectional view along line XIII-XIII in FIG. 12. Although the case of forming the upper electrode 12a made of a transparent conductive film is described by way of illustration above, an upper electrode 12b made of a non-transparent conductive film may be formed as shown in FIGS. 12 and 13. This embodiment thus offers a wider choice of materials to be used as the upper electrode, thereby increasing flexibility in design. In the case of using a non-transparent conductive film, the upper electrode 12b that is larger than the contact hole CH3 by the size of a processing margin or larger is formed, so that the upper electrode 12b is placed on only a part of the photoelectric conversion layer 11 just like in the first embodiment. The second passivation film 13a is made of a silicon nitride film with a thickness of 50 to 120 nm in order to suppress reflection from the surface of the photodiode 100. Preferably, the thickness of the second passivation film 13a is in the range of 70±15 nm to optimize its transmittance.

As described above, in this embodiment, after forming the upper electrode 12a (12b), the pattern of the second passivation film 13a for covering the upper electrode 12a (12b) is formed on the part to serve as the photoelectric conversion layer 11, and then the pattern of the photoelectric conversion layer 11 is formed by etching. After etching of the photoelectric conversion layer 11, the upper electrode 12a (12b) is completely protected with the second passivation film 13a on the patterned photoelectric conversion layer 11. It is thereby possible to reliably remove contamination or the like during damage recovery on the side face of the photodiode 100 or photodiode formation regardless of a material to be used as the upper electrode 12a (12b). With the structure of the connection part of the photodiode 100 with the bias line 16 according to the embodiment, it is possible to appropriately select a material to be used as the upper electrode according to required properties or the like, thereby improving flexibility in design. Further, the same advantage as in the first embodiment can be obtained.

Other Embodiments

Although the array substrate on which the channel-etch TFT 101 is formed is described in the first and second embodiments, another type of the TFT 101, such as a top-gate TFT, may be formed.

Further, although the case of connecting the lower electrode 10 of the photodiode 100 and the drain electrode 7 of the TFT 101 through the contact hole CH1 of the first passivation film 8 is described by way of illustration, the structure of a connection part between the photodiode 100 and the TFT 101 is not limited thereto. This is described hereinbelow.

Figure 14:
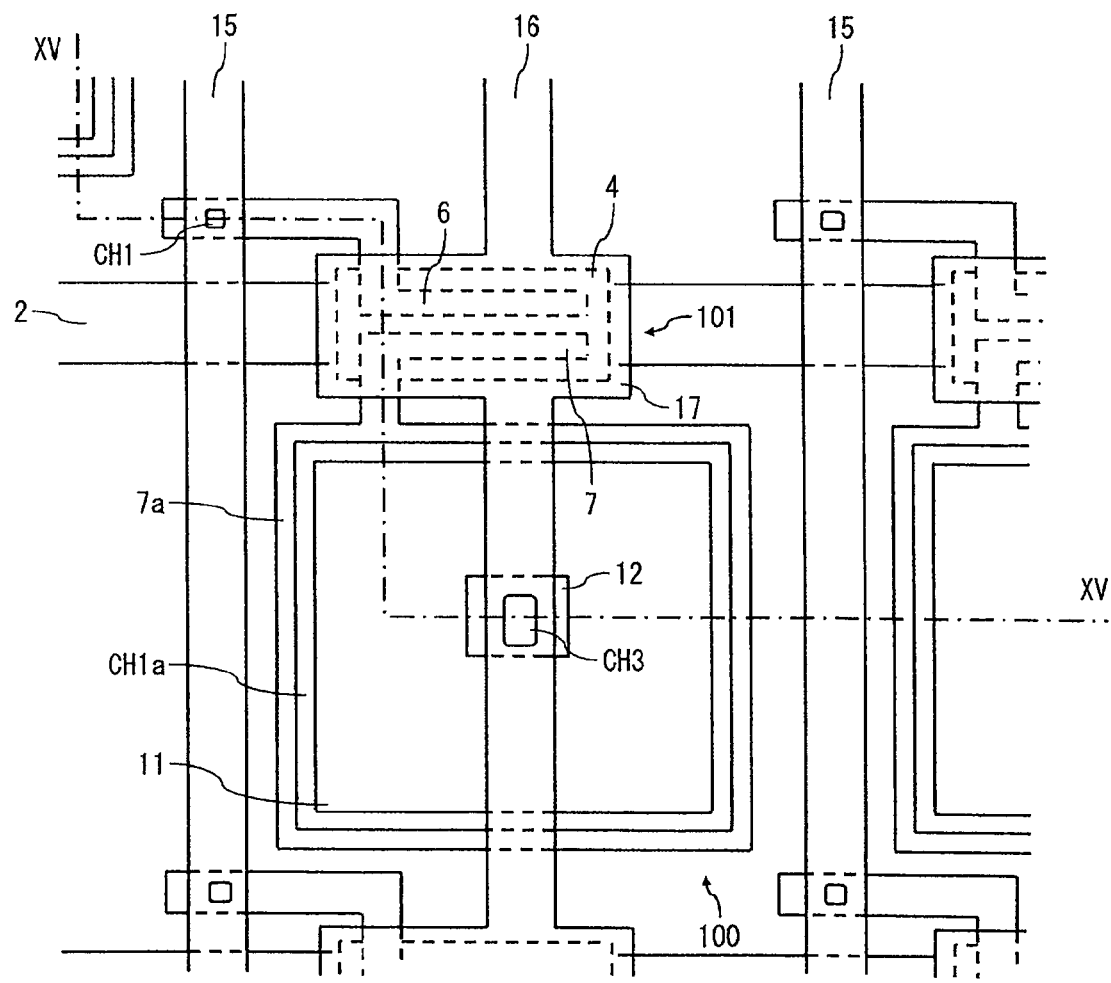
FIG. 14 is a plan view showing a structure of an array substrate according to another embodiment.
Figure 15:
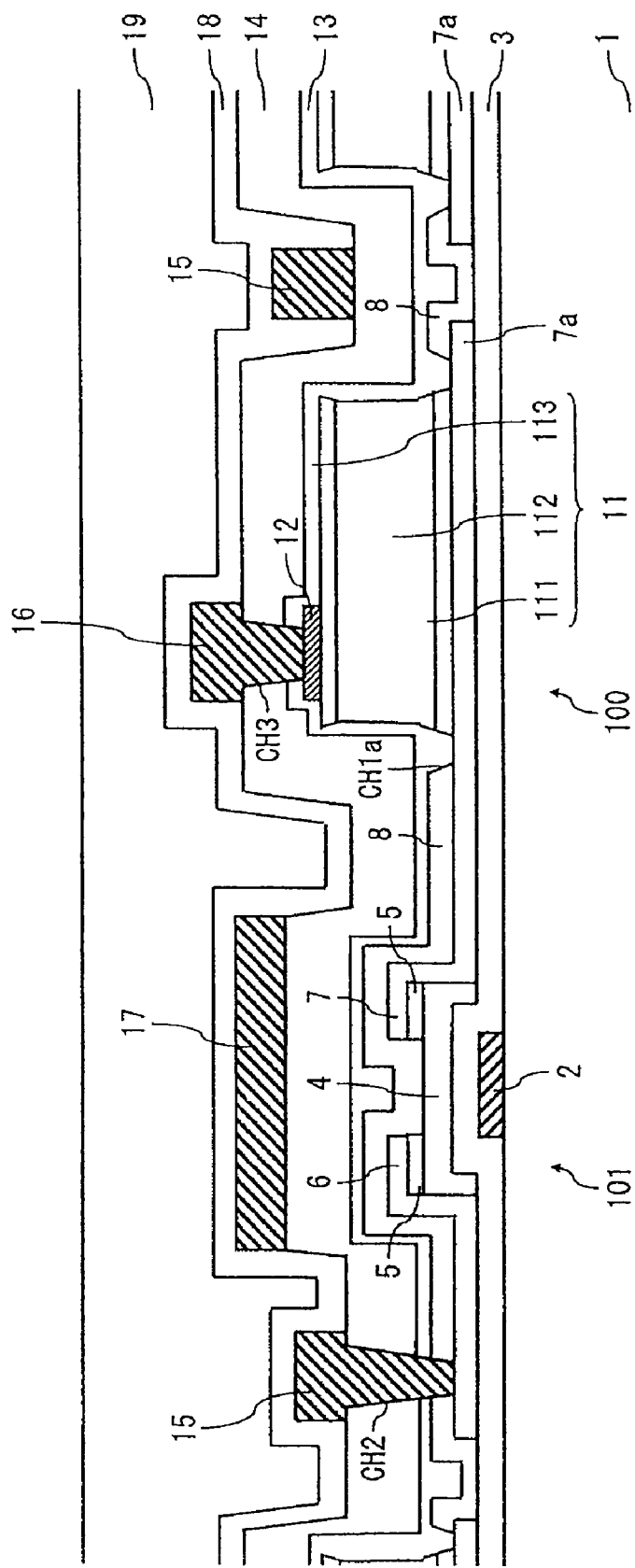
FIG. 15 is a cross-sectional view along line XV-XV in FIG. 14.

FIG. 14 is a plan view showing a structure of an array substrate according to another embodiment of the present invention, and FIG. 15 is a cross-sectional view along line XV-XV in FIG. 14. As shown in FIGS. 14 and 15, the drain electrode 7 may extend to the formation area of the photodiode 100, and an extending part 7a of the drain electrode 7 may serve as a lower electrode of the photodiode 100. Specifically, in a contact hole CH1a made in the first passivation film 8 on the extending part 7a of the drain electrode 7, the photoelectric conversion layer 11 is placed on the extending part 7a of the drain electrode 7 in direct contact therewith. In this case, it is preferred to make the contact hole CH1a having a larger opening width than the photoelectric conversion layer 11 in the first passivation film 8 on the extending part 7a of the drain electrode 7.

Figure 16:
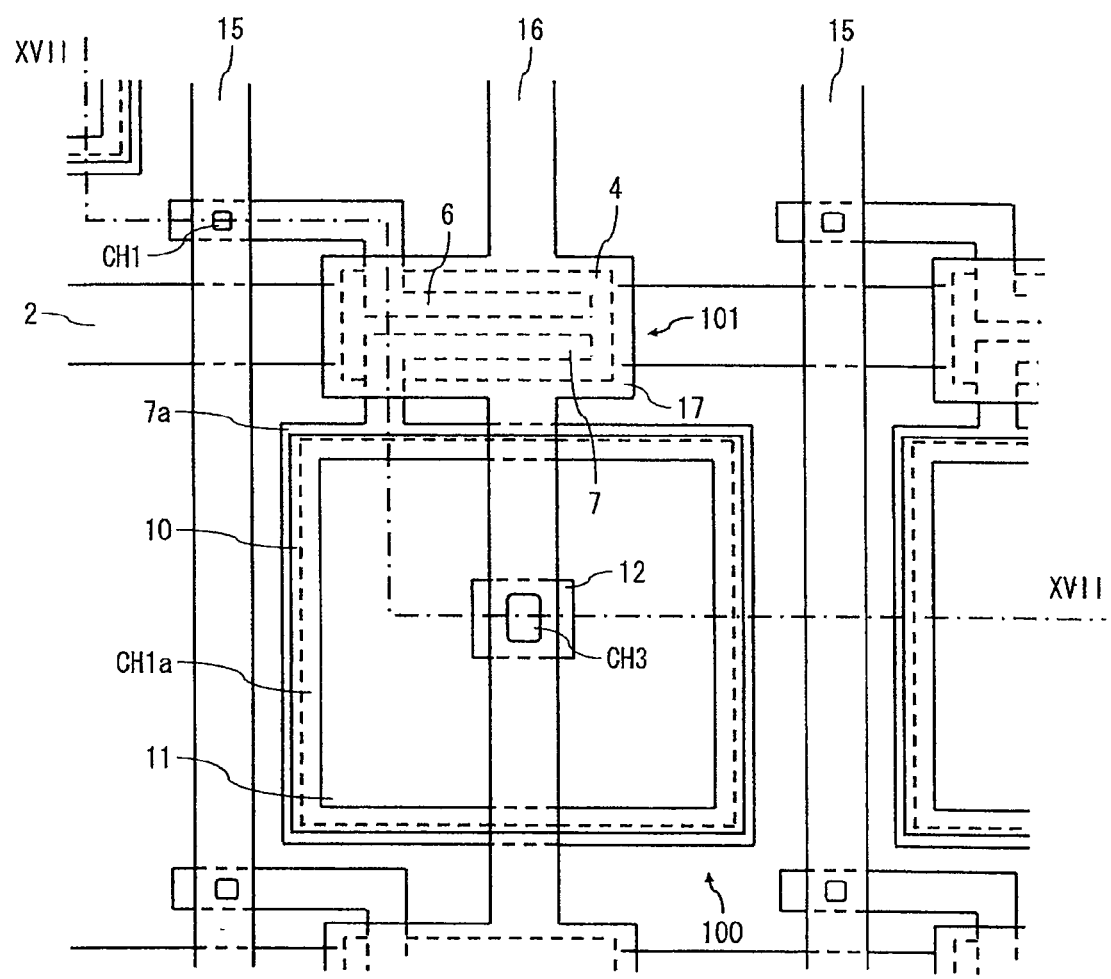
FIG. 16 is a plan view showing a structure of an array substrate according to another example of another embodiment.
Figure 17:
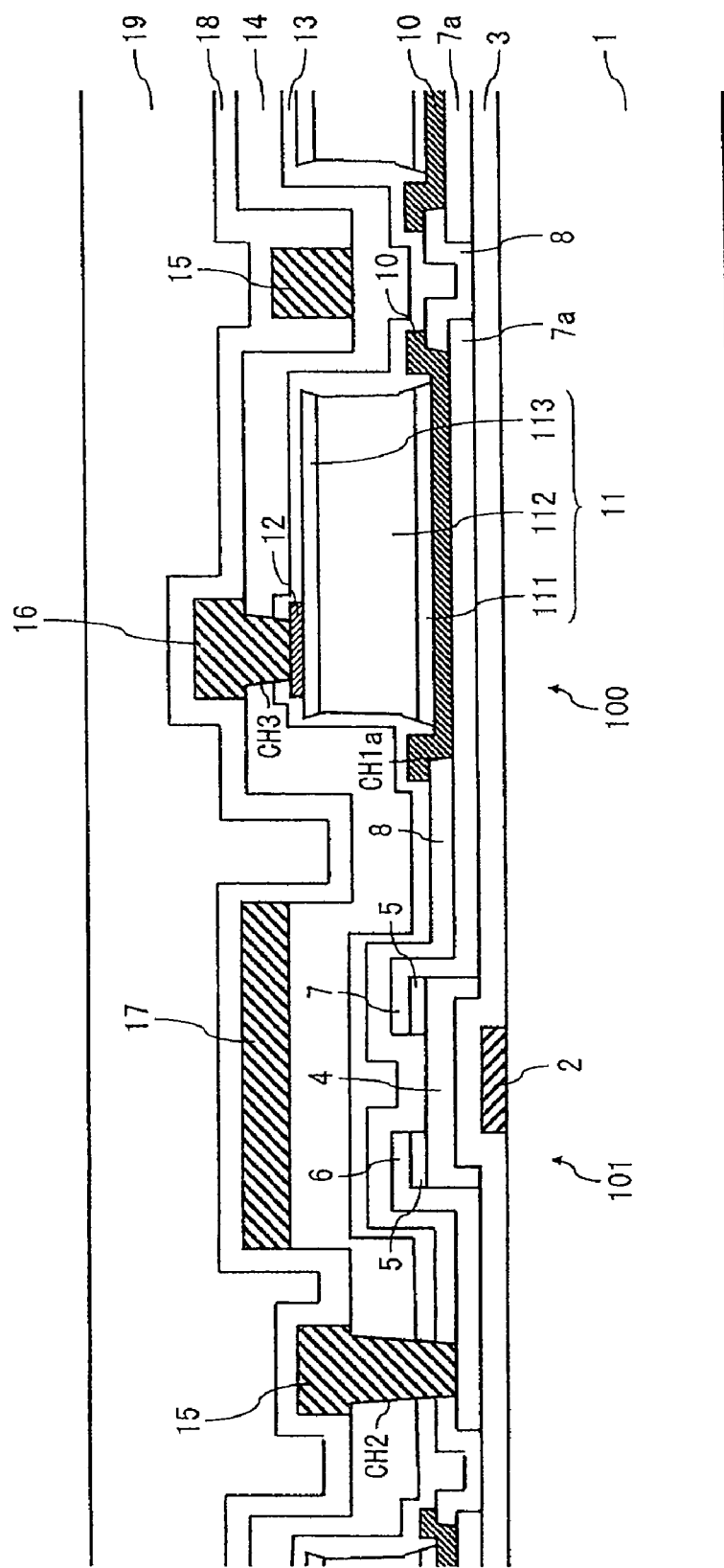
FIG. 17 is a cross-sectional view along line XVII-XVII in FIG. 16.

FIG. 16 is a plan view showing a structure of an array substrate according to another example of the above embodiment, and FIG. 17 is a cross-sectional view along line XVII-XVII in FIG. 16. As shown in FIGS. 16 and 17, the lower electrode 10 may be further placed between the extending part 7a of the drain electrode 7 and the photoelectric conversion layer 11 in the structure shown in FIGS. 14 and 15. Specifically, the lower electrode 10 is placed to cover the contact hole CH1a on the extending part 7a of the drain electrode 7, and the photoelectric conversion layer 11 may be placed thereon to thereby form the photodiode 100.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:
1. A photoelectric conversion device comprising:
 a thin film transistor placed on a substrate;

a photodiode connected to a drain electrode of the thin film transistor and including an upper electrode, a lower electrode and a photoelectric conversion layer placed between the upper and lower electrodes;

a first interlayer insulating film covering at least the upper electrode;

a second interlayer insulating film placed in an upper layer of the first interlayer insulating film and covering the thin film transistor and the photodiode; and a line connected to the upper electrode through a contact hole disposed in the first interlayer insulating film and the second interlayer insulating film.

2. The photoelectric conversion device according to claim 1, wherein the first interlayer insulating film is formed to cover the thin film transistor and the photodiode.

3. The photoelectric conversion device according to claim 1, wherein the first interlayer insulating film is formed in a size equal to a top surface of the photoelectric conversion layer or smaller than the top surface of the photoelectric conversion layer.

4. The photoelectric conversion device according to claim 1, wherein
the first interlayer insulating film is made of a silicon nitride film, and
the second interlayer insulating film is made of a film including a silicon oxide series insulating film at least on a surface in contact with the first interlayer insulating film.

5. The photoelectric conversion device according to claim 4, wherein a thickness of the first interlayer insulating film is in a range of 55 nm to 85 nm.

6. The photoelectric conversion device according to claim 4, wherein the second interlayer insulating film further includes a coating type insulating film in an upper layer than the silicon oxide series insulating film.

7. The photoelectric conversion device according to claim 1, wherein the upper electrode is placed at least on a bottom surface of the contact hole.

8. The photoelectric conversion device according to claim 7, wherein the upper electrode is made of a non-transparent conductive film and placed only on a part of the photoelectric conversion layer.

9. The photoelectric conversion device according to claim 1, further comprising:
a digital board including a low noise amplifier and an A-D converter;
a driver board driving the thin film transistor; and
a reading board reading an electric charge that is converted in the photodiode.

10. The photoelectric conversion device according to claim 9, further comprising:
a passivation film placed in an upper layer of the line; and
a scintillator placed in an upper layer than the passivation film,
wherein the photoelectric conversion device has a function of performing X-ray imaging display by converting an X-ray into visible light by the scintillator.

11. A method of manufacturing a photoelectric conversion device comprising steps of:
forming a thin film transistor on a substrate;
forming a photodiode connected to a drain electrode of the thin film transistor and including an upper electrode, a lower electrode and a photoelectric conversion layer between the upper and lower electrodes, and a first interlayer insulating film covering at least the upper electrode;
forming a second interlayer insulating film in an upper layer of the first interlayer insulating film so as to cover the thin film transistor and the photodiode; and
forming a line connected to the upper electrode through a contact hole disposed in the first interlayer insulating film and the second interlayer insulating film.

12. The method of manufacturing a photoelectric conversion device according to claim 11, wherein the step of forming the photodiode and the first interlayer insulating film comprises steps of:
forming the photodiode by depositing the lower electrode, the photoelectric conversion layer and the upper electrode and by patterning the upper electrode, the photoelectric conversion layer and the lower electrode; and
forming the first interlayer insulating film so as to cover the thin film transistor and the photodiode.

13. The method of manufacturing a photoelectric conversion device according to claim 12, wherein
the step of forming the photodiode and the first interlayer insulating film further comprises a step of performing either one or both of damage recovery processing and cleaning processing on the formed photodiode before forming the first interlayer insulating film, and
in the step of forming the photodiode, a non-transparent conductive film is formed as the upper electrode only on a part of the photoelectric conversion layer.

14. The method of manufacturing a photoelectric conversion device according to claim 11, wherein the step of forming the photodiode and the first interlayer insulating film comprises:
depositing the lower electrode, the photoelectric conversion layer and the upper electrode;
patterning the upper electrode;
depositing the first interlayer insulating film on the upper electrode, and patterning the first interlayer insulating film into a shape covering the upper electrode; and
patterning the photoelectric conversion layer and the lower electrode to form the photodiode.

15. The method of manufacturing a photoelectric conversion device according to claim 14, further comprising a step of:
performing either one or both of damage recovery processing and cleaning processing on the formed photodiode before forming the second interlayer insulating film in a state where the upper electrode is covered with the first interlayer insulating film.

16. The method of manufacturing a photoelectric conversion device according to claim 13, wherein the damage recovery processing is plasma processing using hydrogen gas.

17. The method of manufacturing a photoelectric conversion device according to claim 13, wherein the cleaning processing is wet processing or processing using remote plasma.

18. The method of manufacturing a photoelectric conversion device according to claim 15, wherein the damage recovery processing is plasma processing using hydrogen gas.

19. The method of manufacturing a photoelectric conversion device according to claim 15, wherein the cleaning processing is wet processing or processing using remote plasma.

* * * * *